United States Patent
Tsai et al.

(10) Patent No.: US 11,990,404 B2
(45) Date of Patent: May 21, 2024

(54) HEAT DISSIPATION FOR SEMICONDUCTOR DEVICES AND METHODS OF MANUFACTURE

(71) Applicant: Taiwan Semiconductor Manufacturing Co., Ltd., Hsinchu (TW)

(72) Inventors: Chen-Fong Tsai, Hsinchu (TW); Cheng-I Chu, Taipei (TW); Jyh-Cherng Sheu, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 208 days.

(21) Appl. No.: 17/381,583

(22) Filed: Jul. 21, 2021

(65) Prior Publication Data
US 2022/0359369 A1    Nov. 10, 2022

Related U.S. Application Data

(60) Provisional application No. 63/184,506, filed on May 5, 2021.

(51) Int. Cl.
| | |
|---|---|
| *H01L 21/00* | (2006.01) |
| *H01L 23/367* | (2006.01) |
| *H01L 23/46* | (2006.01) |
| *H01L 23/528* | (2006.01) |
| *H01L 29/40* | (2006.01) |
| *H01L 29/417* | (2006.01) |

(Continued)

(52) U.S. Cl.
CPC ........ *H01L 23/528* (2013.01); *H01L 23/3672* (2013.01); *H01L 23/46* (2013.01); *H01L 29/401* (2013.01); *H01L 29/41733* (2013.01); *H01L 29/0665* (2013.01); *H01L 29/42392* (2013.01)

(58) Field of Classification Search
CPC .... H01L 23/528; H01L 23/3672; H01L 23/46
See application file for complete search history.

(56) References Cited

U.S. PATENT DOCUMENTS

| | | |
|---|---|---|
| 6,242,778 B1 | 6/2001 | Marmillion et al. |
| 6,956,289 B2 | 10/2005 | Kunikiyo |

(Continued)

FOREIGN PATENT DOCUMENTS

| | | | | |
|---|---|---|---|---|
| CN | 115084053 A | * | 9/2022 | ......... H01L 23/3672 |
| CN | 115910940 A | * | 4/2023 | ......... H01L 21/6835 |

(Continued)

*Primary Examiner* — Laura M Menz
(74) *Attorney, Agent, or Firm* — Slater Matsil, LLP

(57) ABSTRACT

Semiconductor devices having improved heat dissipation and methods of forming the same are disclosed. In an embodiment, a device includes a first transistor structure; a front-side interconnect structure on a front-side of the first transistor structure, the front-side interconnect structure including front-side conductive lines; a backside interconnect structure on a backside of the first transistor structure, the backside interconnect structure including backside conductive lines, the backside conductive lines having line widths greater than line widths of the front-side conductive lines; and a first heat dissipation substrate coupled to the backside interconnect structure.

20 Claims, 59 Drawing Sheets

(51) Int. Cl.
*H01L 29/06* (2006.01)
*H01L 29/423* (2006.01)

(56) References Cited

U.S. PATENT DOCUMENTS

| | | | |
|---|---|---|---|
| 8,299,563 B2 | 10/2012 | Gambino et al. | |
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 11,195,818 B2* | 12/2021 | Chen | H01L 27/088 |
| 11,450,600 B2* | 9/2022 | Huang | H01L 23/5223 |
| 11,482,564 B2 | 10/2022 | Yoon et al. | |
| 11,798,947 B2 | 10/2023 | Kim et al. | |
| 2014/0367777 A1 | 12/2014 | Huang et al. | |
| 2020/0294998 A1* | 9/2020 | Lilak | H01L 23/53295 |
| 2021/0082873 A1* | 3/2021 | Chen | H01L 23/522 |
| 2021/0335690 A1* | 10/2021 | Huang | H01L 28/10 |
| 2022/0028752 A1* | 1/2022 | Huang | H01L 29/66545 |
| 2022/0310472 A1* | 9/2022 | Huang | H01L 29/66795 |
| 2022/0359369 A1* | 11/2022 | Tsai | H01L 23/3672 |
| 2023/0187307 A1* | 6/2023 | Yu | H01L 23/36 257/213 |
| 2023/0335519 A1* | 10/2023 | Chen | H01L 25/0652 |

FOREIGN PATENT DOCUMENTS

| | | | | |
|---|---|---|---|---|
| DE | 102020103710 A1 | | 9/2020 | |
| DE | 102021119223 A1 * | | 11/2022 | H01L 23/3672 |
| EP | 3945554 A1 * | | 2/2022 | H01L 21/02603 |
| JP | 2001196372 A | | 7/2001 | |
| JP | 2010153799 A | | 7/2010 | |
| KR | 20190038031 A | | 4/2019 | |
| KR | 20200134362 A | | 12/2020 | |
| TW | 426969 B | | 3/2001 | |
| TW | 202111891 A | | 3/2021 | |
| TW | 202147452 A * | | 12/2021 | H01L 21/823412 |

\* cited by examiner

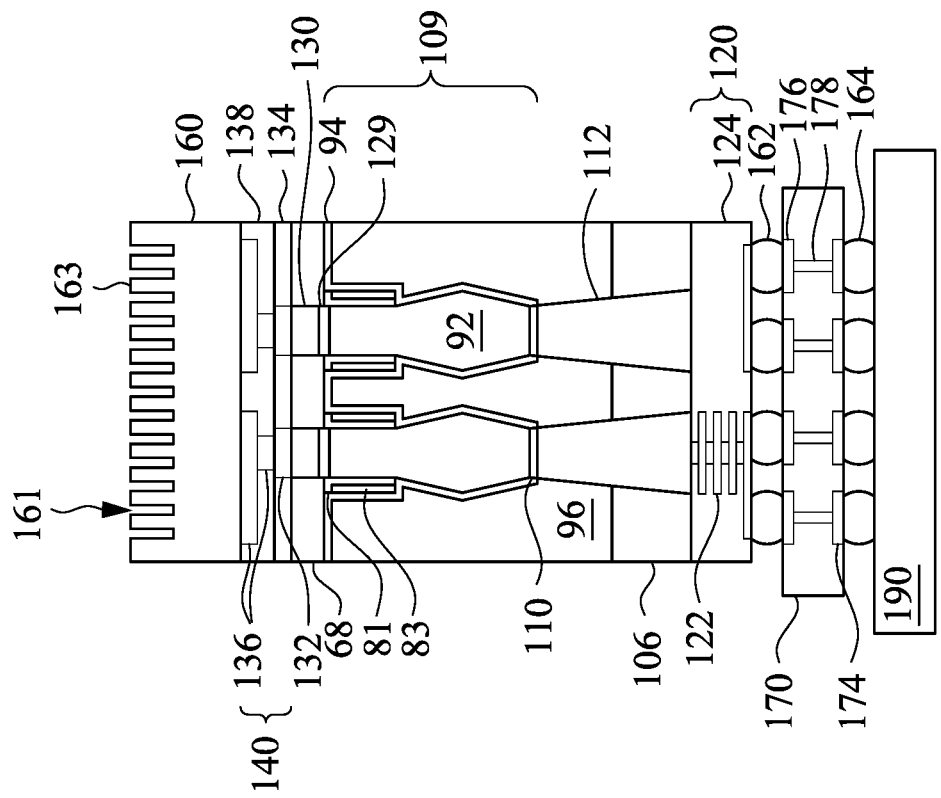
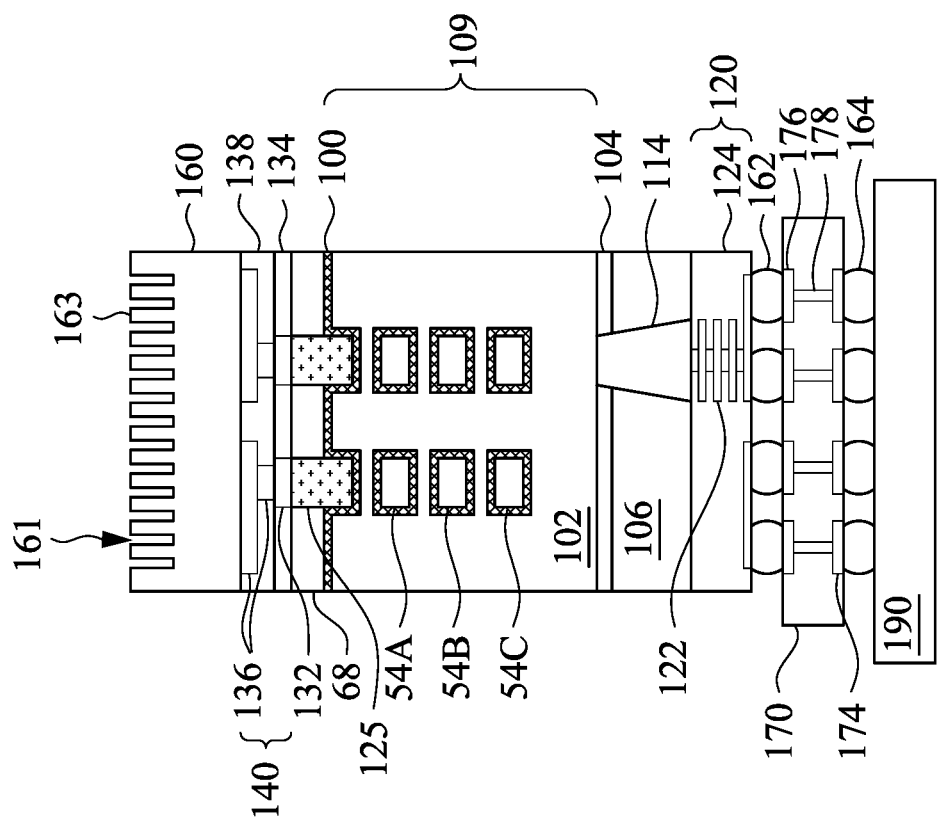
Figure 30A
Figure 30B

HEAT DISSIPATION FOR SEMICONDUCTOR DEVICES AND METHODS OF MANUFACTURE

CROSS-REFERENCE TO RELATED APPLICATIONS

This application claims the benefit of U.S. Provisional Application No. 63/184,506, filed on May 5, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, 30C, 31A, 31B, and 31C are cross-sectional views of intermediate stages in the manufacturing of nano-FETs, in accordance with some embodiments.

DETAILED DESCRIPTION

Figure 1:
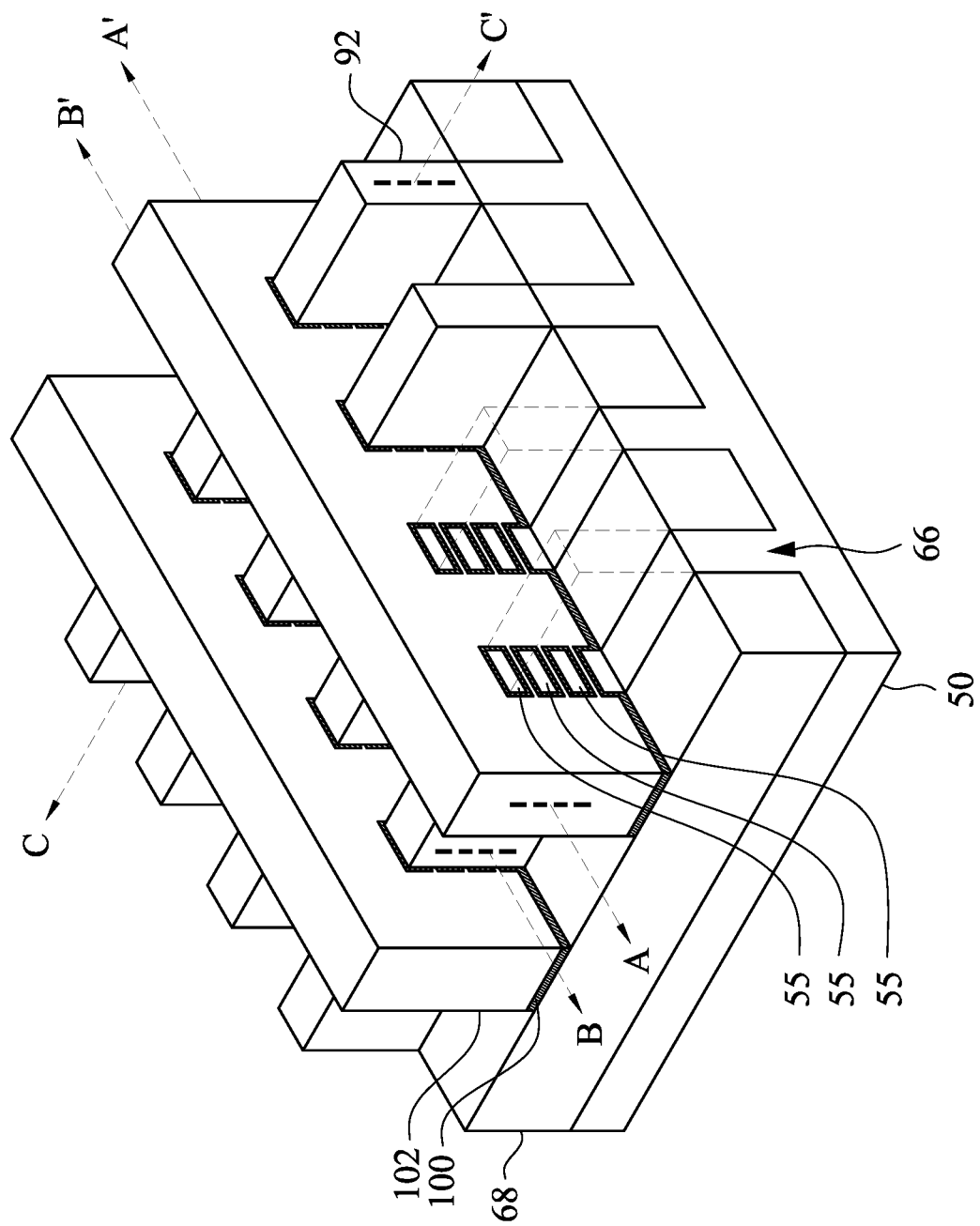
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices having improved heat dissipation and methods of forming the same. The semiconductor devices may include a front-side interconnect structure (also referred to as a back end of line (BEOL) interconnect structure) and a backside interconnect structure (also referred to as a buried power network (BPN)) on opposite sides of a transistor structure. Providing the backside interconnect structure may reduce the number of layers required for the front-side interconnect structure, and the backside interconnect structure may have wider lines than the front-side interconnect structure, both of which provide improved heat dissipation through the front-side interconnect structure and the backside interconnect structure. In some embodiments, the front-side interconnect structure may be coupled to a heat sink and the backside interconnect structure may be coupled to a substrate. The substrate may include embedded fluid channels and heat may be dissipated through both the heat sink and the substrate. In some embodiments, the front-side interconnect structure may be coupled to a substrate and the backside interconnect structure may be coupled to a heat sink. Heat may be dissipated through the heat sink. Providing the backside interconnect structure and dissipating heat through the backside interconnect structure as well as the front-side interconnect structure improves heat dissipation, improves device performance, and reduces device defects.

Embodiments are described below in a particular context, namely, a die comprising nano-FETs. Various embodiments may be applied, however, to dies comprising other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs (Nano-FETs), or the like) in a three-dimensional view, in accordance with some embodiments. The nano-FETs comprise nanostructures 55 (e.g., nanosheets, nanowires, or the like) over fins 66 on a substrate 50 (e.g., a semiconductor substrate). The nanostructures 55 act as channel regions for the nano-FETs. The nanostructures 55 may include p-type nanostructures, n-type nanostructures, or a combination thereof. Isolation regions 68 are disposed between adjacent fins 66, which may protrude above and from between neighboring isolation regions 68. Although the isolation regions 68 are described and illustrated as being separate from the substrate 50, as used herein, the term "substrate" may refer to the semiconductor substrate alone or a combination of the semiconductor substrate and the isolation regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring isolation regions 68.

Gate dielectric layers 100 are over top surfaces and sidewalls of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects which may be used in planar devices, such as planar FETs, or in fin field-effect transistors (FinFETs).

FIGS. 2 through 31C are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, and 31A illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, 21B, 22B, 23B, 24B, 25B, 26B, 27B, 28B, 29B, 30B, and 31B illustrate reference cross-section B-B' illustrated in FIG. 1. FIGS. 6C, 7C, 8C, 9C, 10C, 11C, 11D, 12C, 12E, 13C, 14C, 15C, 16C, 17C, 18C, 19C, 20C, 21C, 22C, 23C, 24C, 25C, 26C, 27C, 28C, 29C, 30C, and 31C illustrate reference cross-section C-C' illustrated in FIG. 1.

Figure 2:
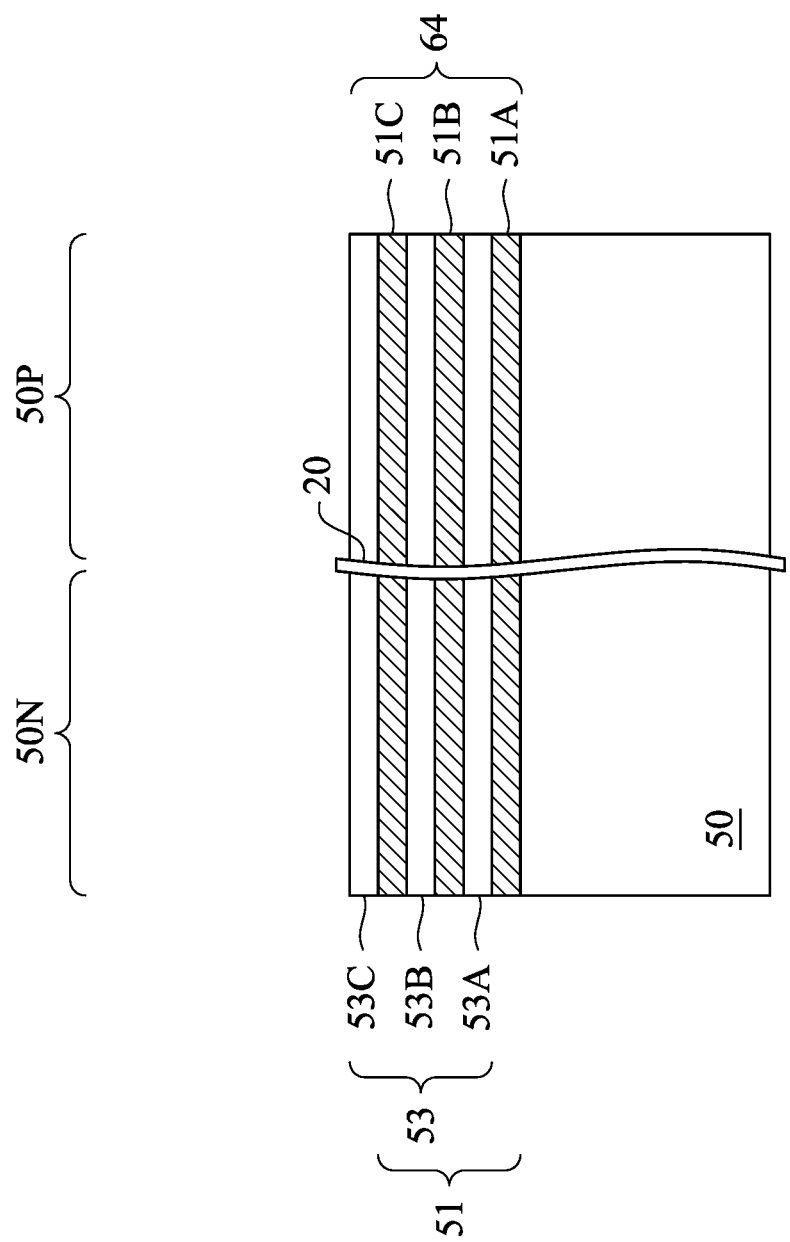

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs. The p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, or the like) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the n-type region 50N and the p-type region 50P. In such embodiments, the channel regions in both the n-type region 50N and the p-type region 50P may have a same material composition (e.g., silicon, or the another semiconductor material) and may be formed simultaneously.

In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments, the first semiconductor layers 51 may be removed and the second semiconductor layers 53 may be patterned to form channel regions of nano-FETs in both the n-type region 50N and the p-type region 50P.

The multi-layer stack 64 is illustrated as including three layers of the first semiconductor layers 51 and three layers of the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In some embodiments, the first semiconductor layers 51 may be formed of a first semiconductor material suitable for p-type nano-FETs, such as silicon germanium or the like. The second semiconductor layers 53 may be formed of a second semiconductor material suitable for n-type nano-FETs, such as silicon, silicon carbide, or the like. The multi-layer stack 64 is illustrated as having a bottommost first semiconductor layer 51 formed of the first semiconductor material for illustrative purposes. In some embodiments, the multi-layer stack 64 may be formed having a bottommost second semiconductor layer 53 formed of the second semiconductor material.

The first semiconductor material and the second semiconductor material may be materials having a high etch selectivity to one another. As such, the first semiconductor layers 51 of the first semiconductor material may be removed without significantly removing the second semiconductor layers 53 of the second semiconductor material. This allows the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material. This allows the first semiconductor layers 51 to be patterned to form channel regions of nano-FETs.

Figure 3:
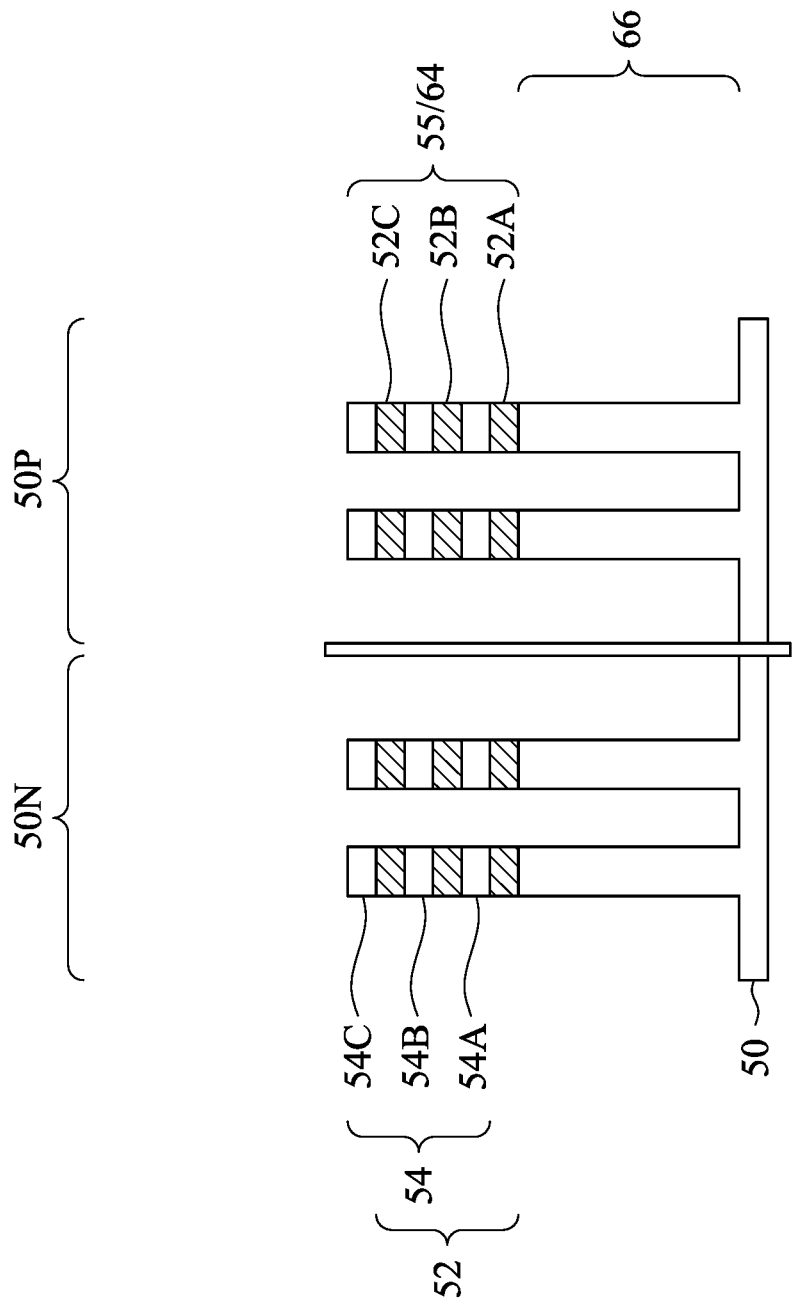

In FIG. 3, fins 66 are formed in the substrate 50 and nanostructures 55 are formed in the multi-layer stack 64. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etching (RIE), neutral beam etching (NBE), the like, or a combination thereof. The etching may be anisotropic. Forming the nanostructures 55 by etching the multi-layer stack 64 may further define first nanostructures 52A-C (collectively referred to as first nanostructures 52) from the first semiconductor layers 51 and define second nanostructures 54A-C (collectively referred to as second nanostructures 54) from the second semiconductor layers 53. The first nanostructures 52 and the second nanostructures 54 may be collectively referred to as the nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66 and the nanostructures 55.

FIG. 3 illustrates the fins 66 and the nanostructures 55 in the n-type region 50N and the p-type region 50P as having substantially equal widths for illustrative purposes. In some embodiments, widths of the fins 66 and the nanostructures 55 in the n-type region 50N may be greater than or less than widths of the fins 66 and the nanostructures 55 in the p-type region 50P. Further, while each of the fins 66 and the nanostructures 55 are illustrated as having consistent widths throughout, in some embodiments, the fins 66 and/or the nanostructures 55 may have tapered sidewalls. As such, a width of each of the fins 66 and/or the nanostructures 55 may continuously increase in a direction towards the substrate 50. In such embodiments, each of the nanostructures 55 in a vertical stack may have a different width and may be trapezoidal in shape.

Figure 4:
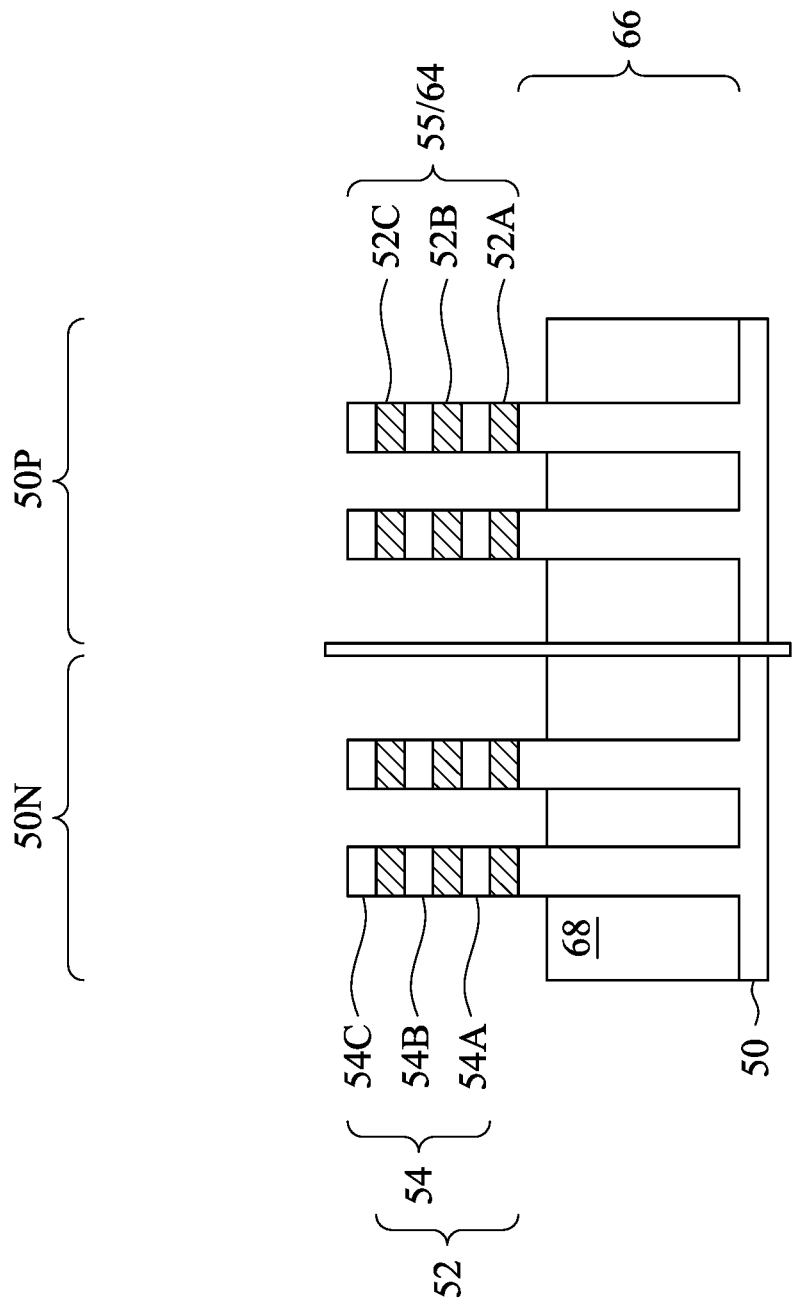

In FIG. 4, shallow trench isolation (STI) regions 68 are formed adjacent the fins 66. The STI regions 68 may be formed by depositing an insulation material over the substrate 50, the fins 66, and the nanostructures 55, and between adjacent ones of the fins 66 and the nanostructures 55. The insulation material may be an oxide (such as silicon oxide), a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the nanostructures 55. Although the insulation material is illustrated as a single layer, some embodiments may utilize multiple layers. For example, in some embodiments a liner (not separately illustrated) may be formed along surfaces of the substrate 50, the fins 66, and the nanostructures 55. Thereafter, a fill material, such as those discussed above, may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55, such that top surfaces of the nanostructures 55 and the insulation material are level after the planarization process is complete.

The insulation material is then recessed to form the STI regions 68. The insulation material is recessed such that the nanostructures 55 and the fins 66 in the n-type region 50N and the p-type region 50P protrude from between neighboring ones of the STI regions 68. Top surfaces of the STI regions 68 may have flat surfaces as illustrated, convex surfaces, concave surfaces (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the nanostructures 55). As illustrated in FIG. 4, top surfaces of the STI regions 68 may be above top surfaces of the fins 66. However, in some embodiments, the top surfaces of the STI regions 68 may be disposed level with or below the top surfaces of the fins 66. In some embodiments, an oxide removal using dilute hydrofluoric (dHF) acid may be used to etch back the insulation material.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer may be formed over a top surface of the substrate 50, and trenches may be etched through the dielectric layer to expose the underlying substrate 50. Epitaxial structures may be epitaxially grown in the trenches, and the dielectric layer may be recessed such that the epitaxial structures protrude from the dielectric layer to form the fins 66 and/or the nanostructures 55. The epitaxial structures may comprise alternating layers of the semiconductor materials discussed above, such as the first semiconductor material and the second semiconductor material. In some embodiments where epitaxial structures are epitaxially grown, the epitaxially grown materials may be in situ doped during growth, which may obviate prior and/or subsequent implantations. In some embodiments, in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist may be formed by using a spin-on technique and may be patterned using acceptable photolithography techniques. Once the photoresist is patterned, an n-type impurity implant is performed in the p-type region 50P, and the photoresist may act as a mask to prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist may be formed by using a spin-on technique and may be patterned using acceptable photolithography techniques. Once the photoresist is patterned, a p-type impurity implant may be performed in the n-type region 50N, and the photoresist may act as a mask to prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations. In some embodiments, in situ and implantation doping may be used together.

Figure 5:
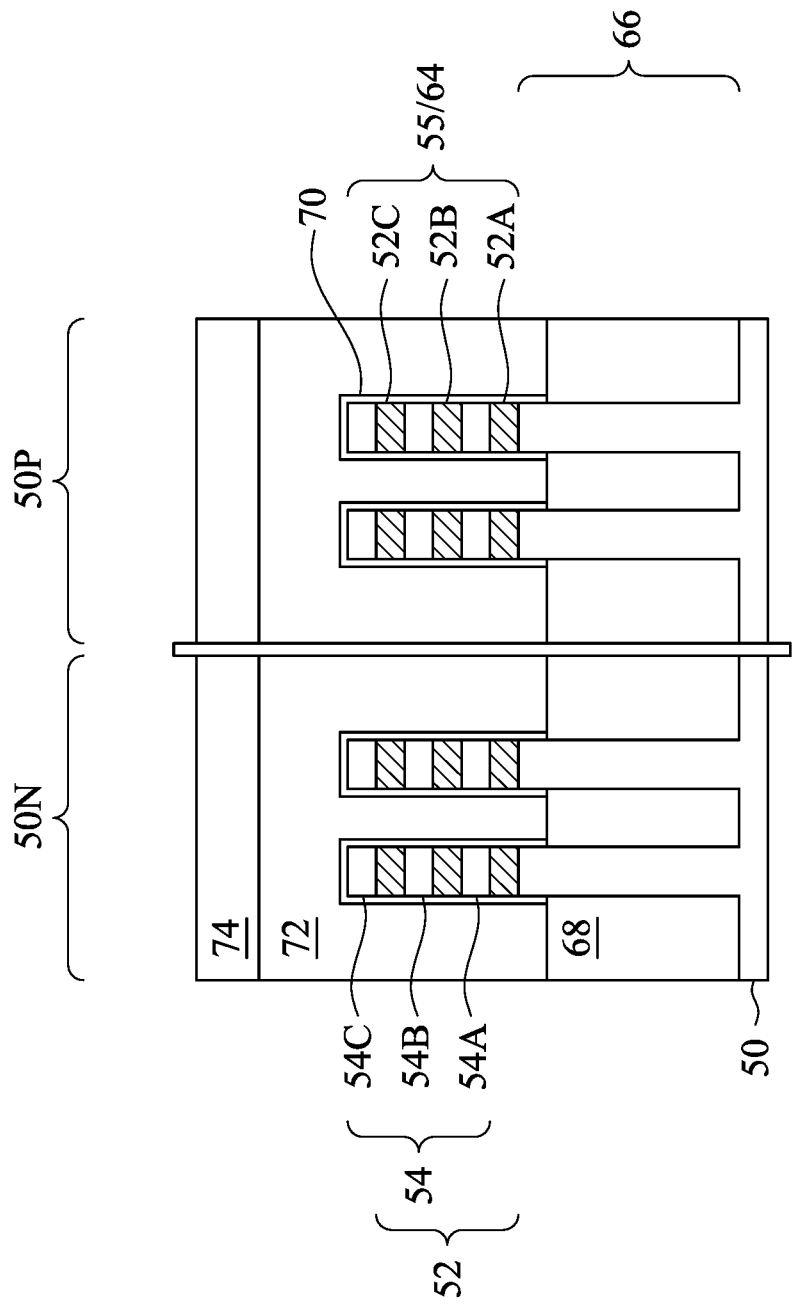

In FIG. 5, a dummy dielectric layer 70 is formed on the fins 66 and/or the nanostructures 55. The dummy dielectric layer 70 may be, for example, silicon oxide, silicon nitride, a combination thereof, or the like. The dummy dielectric layer 70 may be deposited or thermally grown according to acceptable techniques.

A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of the STI regions 68.

The mask layer 74 may be deposited over the dummy gate layer 72. The mask layer 74 may include, for example, silicon nitride, silicon oxynitride, or the like. In the illustrated embodiment, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68. As such, the dummy dielectric layer 70 may extend between the dummy gate layer 72 and the STI regions 68.

Figure 6B:
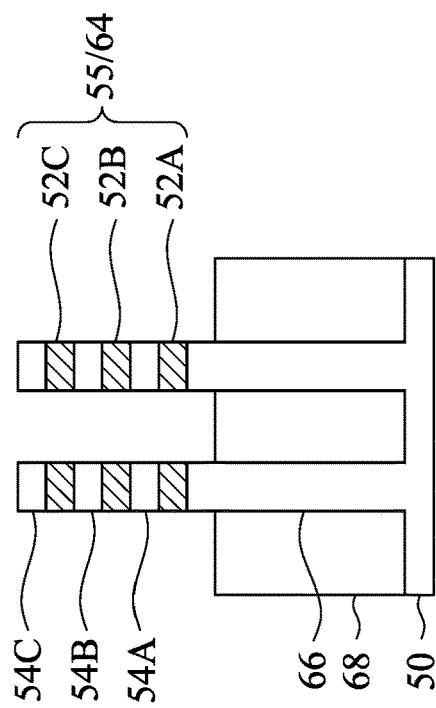
Figure 6A:
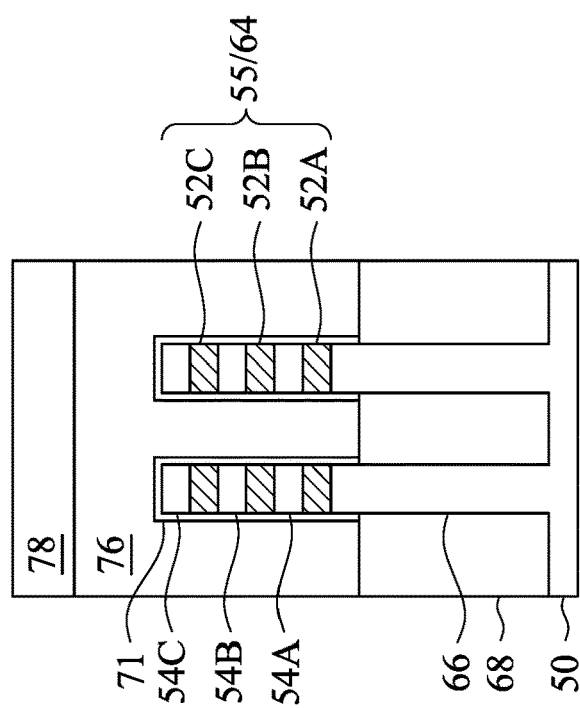
Figure 6C:
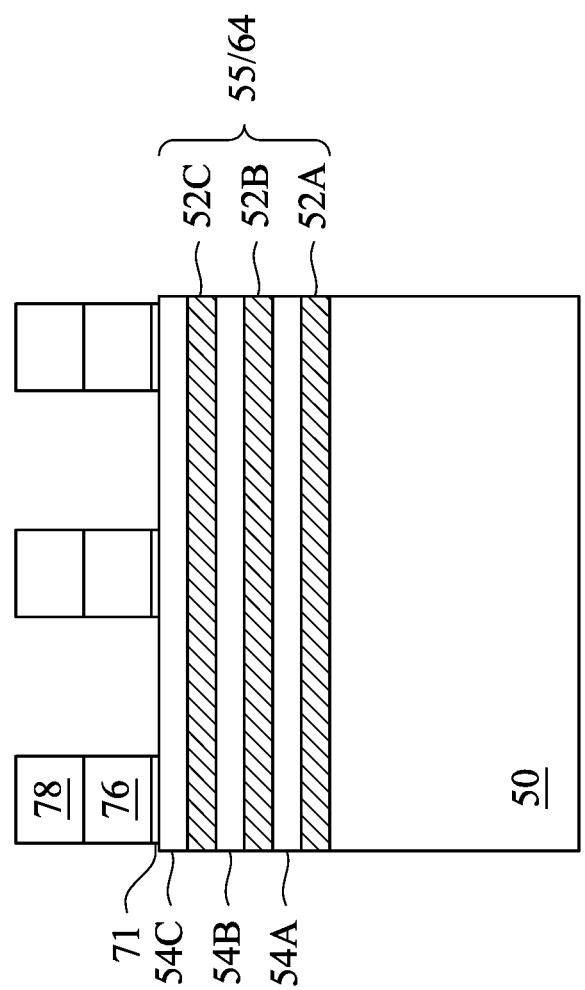

FIGS. 6A through 31C illustrate various additional steps in the manufacturing of embodiment devices. FIGS. 6A through 31C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 may be transferred to the dummy gate layer 72 and to the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may have a lengthwise direction perpendicular to the lengthwise direction of respective fins 66 and nanostructures 55.

Figure 7B:
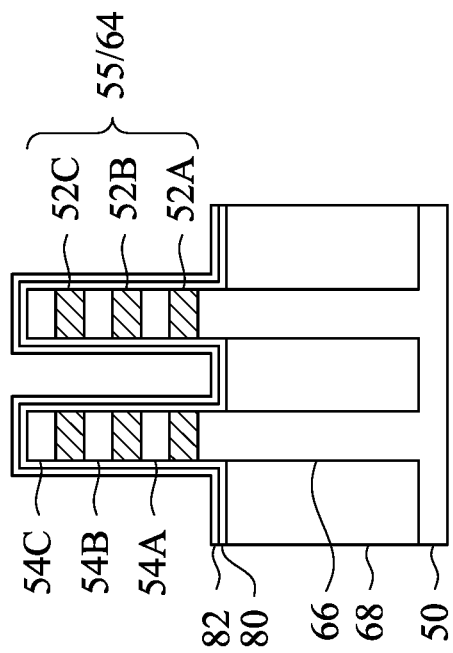
Figure 7A:
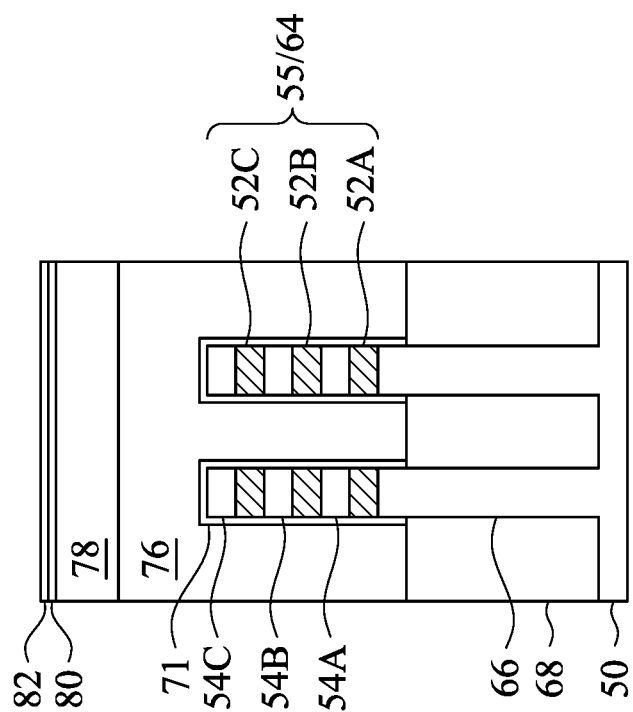
Figure 7C:
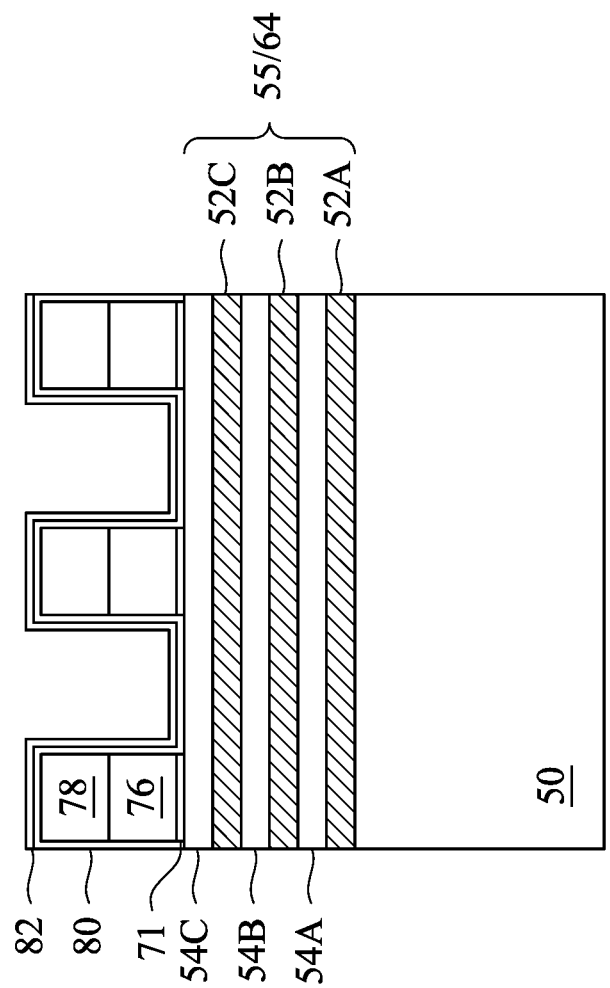

In FIGS. 7A through 7C, a first spacer layer 80 and a second spacer layer 82 are formed over the structures illustrated in FIGS. 6A through 6C, respectively. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the nanostructures 55 and the masks 78; and sidewalls of the dummy gates 76, the dummy gate dielectrics 71, and the fins 66. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and the nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and the nanostructures 55 in the n-type region 50N. The mask may then be removed.

The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8B:
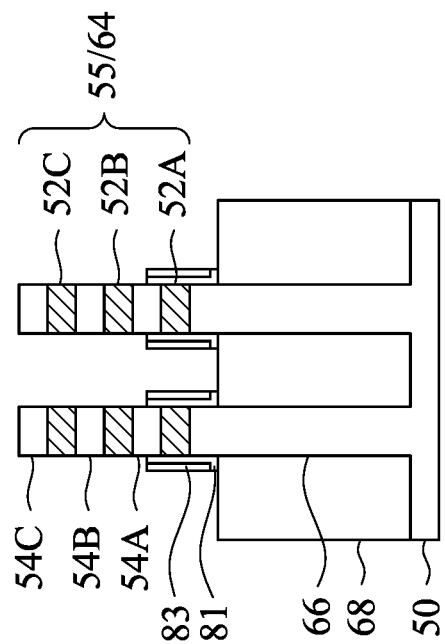
Figure 8A:
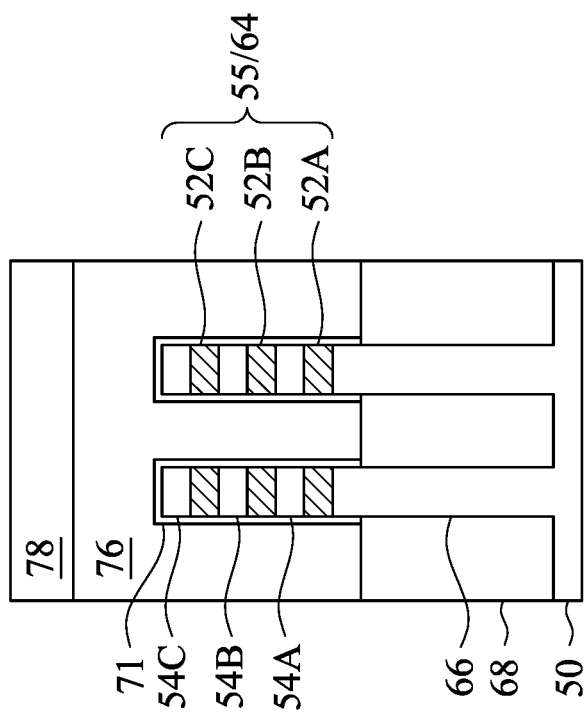
Figure 8C:
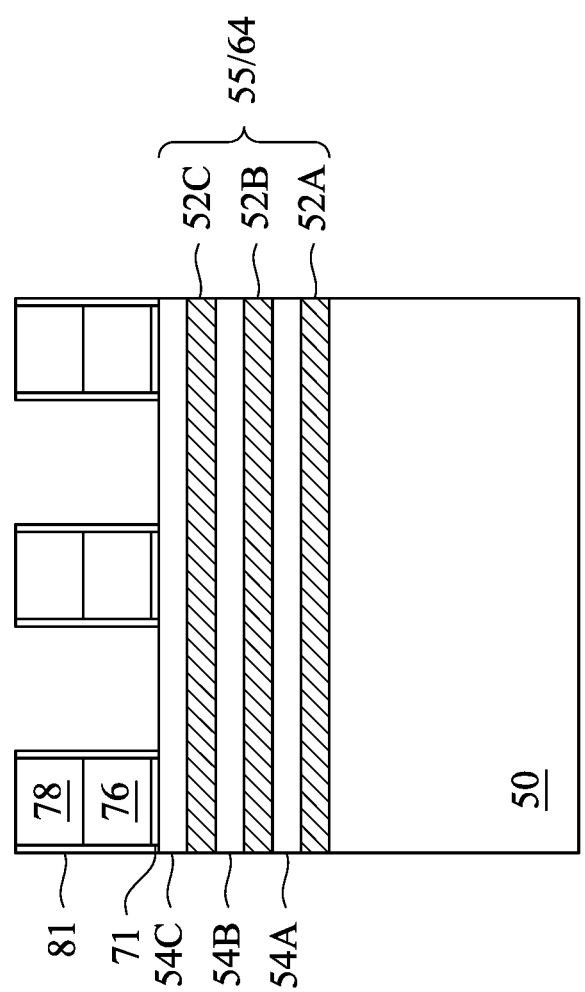

In FIGS. 8A through 8C, the first spacer layer 80 and the second spacer layer 82 are etched to form first spacers 81 and second spacers 83, respectively. As will be discussed in greater detail below, the first spacers 81 and the second spacers 83 act to self-align subsequently formed source/drain regions, as well as to protect sidewalls of the fins 66 and/or the nanostructures 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and the second spacer layer 82 may act as a mask when patterning the first spacer layer 80. For example, the second spacer layer 82 may be etched using an anisotropic etch process with the first spacer layer 80 acting as an etch stop layer. Remaining portions of the second spacer layer 82 form the second spacers 83 as illustrated in FIG. 8B. Thereafter, the second spacers 83 act as a mask while etching exposed portions of the first spacer layer 80, forming the first spacers 81, as illustrated in FIGS. 8B and 8C.

As illustrated in FIG. 8B, the first spacers 81 and the second spacers 83 are disposed on sidewalls of the nanostructures 55 and the fins 66. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequences of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
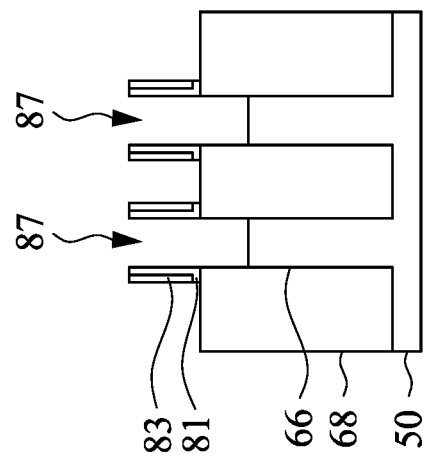
Figure 9A:
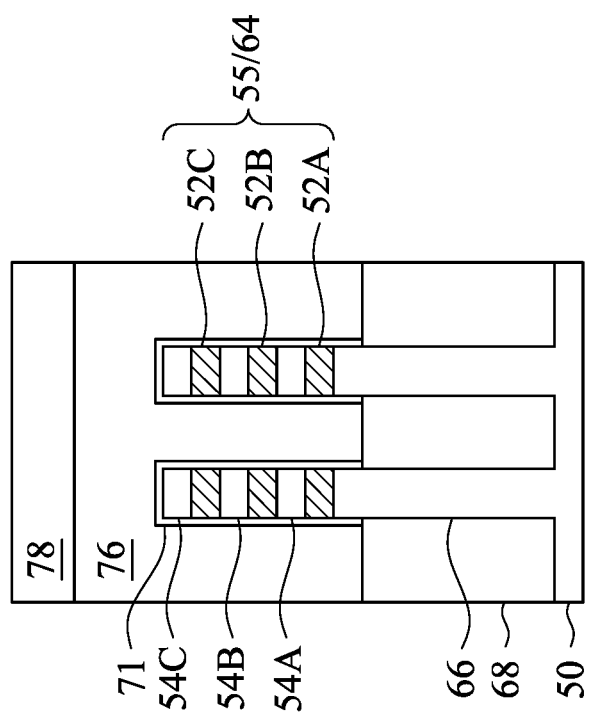
Figure 9C:
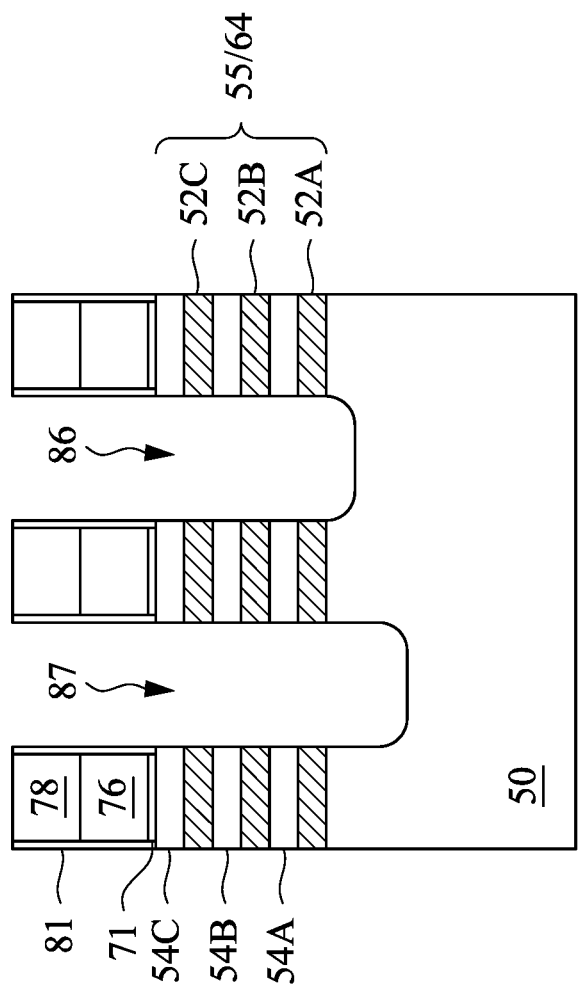

In FIGS. 9A through 9C, first recesses 86 and second recesses 87 are formed in the nanostructures 55, the fins 66, and the substrate 50. Epitaxial materials, which may be used as source/drain regions and/or dummy regions, will be subsequently formed in the first recesses 86 and the second recesses 87. The first recesses 86 may extend through the first nanostructures 52A-52C and the second nanostructures 54A-54C and into the fins 66 and the substrate 50. In some embodiments, top surfaces of the STI regions 68 may be level with bottom surfaces of the first recesses 86. In some embodiments, the top surfaces of the STI regions 68 may be above or below the bottom surfaces of the first recesses 86. The second recesses 87 may extend through the first nanostructures 52A-52C and the second nanostructures 54A-54C and into the fins 66 and the substrate 50 to a depth greater than the first recesses 86. Bottom surfaces of the second recesses 87 may be disposed below the bottom surfaces of the first recesses 86 and the top surfaces of the STI regions 68.

The first recesses 86 and the second recesses 87 may be formed by etching the nanostructures 55, the fins 66, and the substrate 50 using anisotropic etching processes, such as RIE, NBE, or the like. The first spacers 81, the second spacers 83, and the masks 78 mask portions of the nanostructures 55, the fins 66, and the substrate 50 during the etching processes used to form the first recesses 86 and the second recesses 87. A single etch process or multiple etch processes may be used to etch each layer of nanostructures 55, the fins 66, and the substrate 50. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 10B:
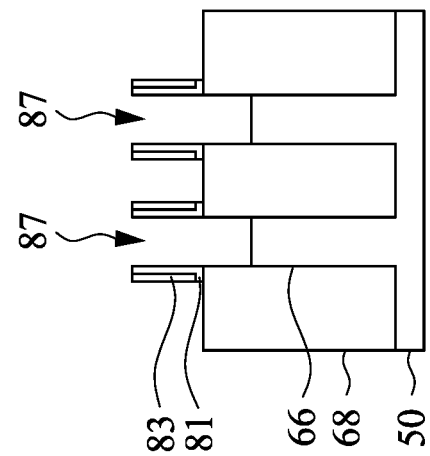
Figure 10A:
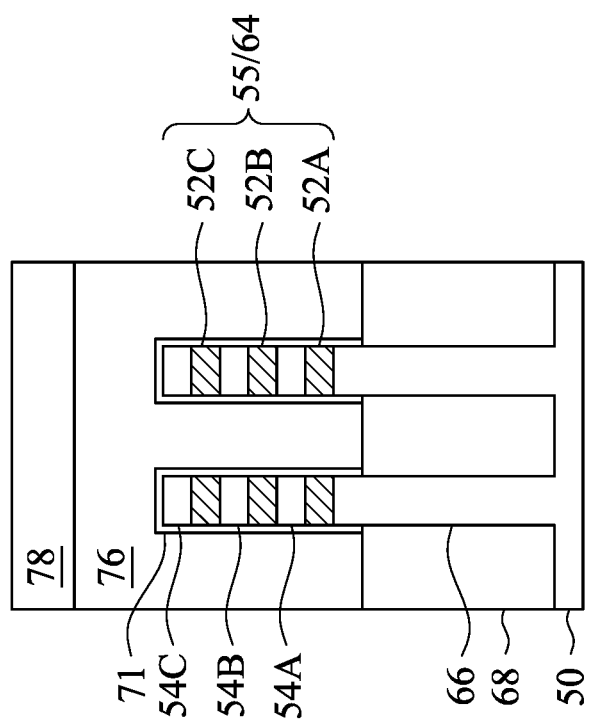
Figure 10C:
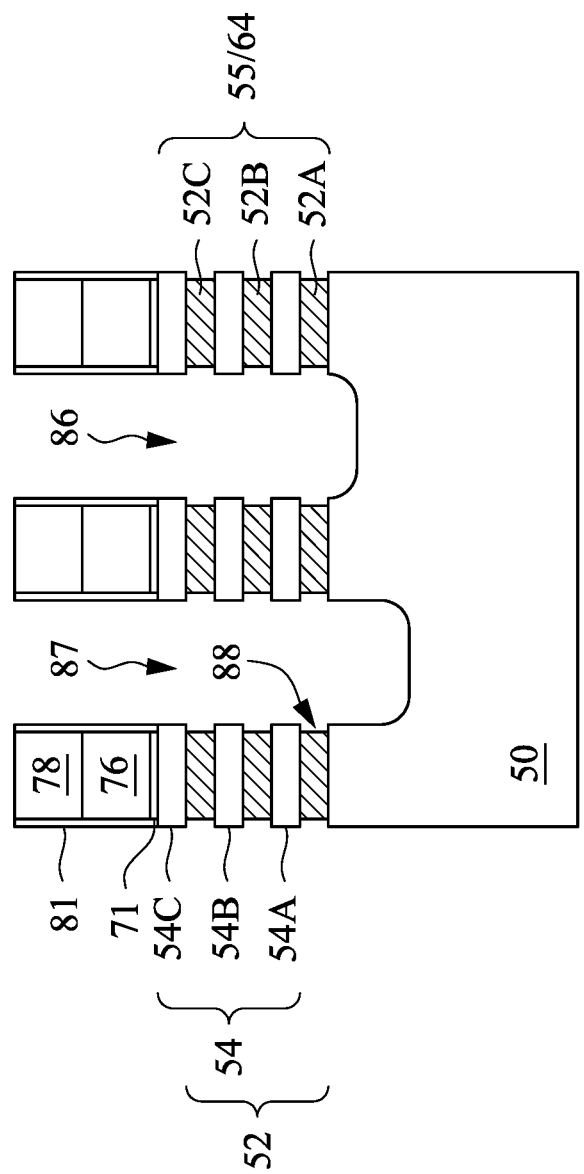

In FIGS. 10A through 10C, portions of sidewalls of the layers of the multi-layer stack 64 formed of the first semiconductor material (e.g., the first nanostructures 52) exposed by the first recesses 86 and the second recesses 87 are etched to form sidewall recesses 88 in the n-type region 50N and the p-type region 50P. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the second nanostructures 54 include, e.g., Si or SiC, and the first nanostructures 52 include, e.g., SiGe, a wet or dry etch process with hydrogen fluoride, another fluorine-based etchant, or the like may be used to etch sidewalls of the first nanostructures 52 in the n-type region 50N and the p-type region 50P.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and gate structures. As will be discussed in greater detail below, the source/drain regions will be formed in the first recesses 86 and the second recesses 87, while first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from the sidewalls of the second nanostructures 54.

Figure 11B:
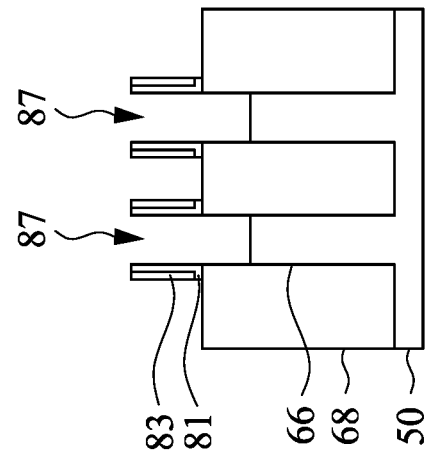
Figure 11A:
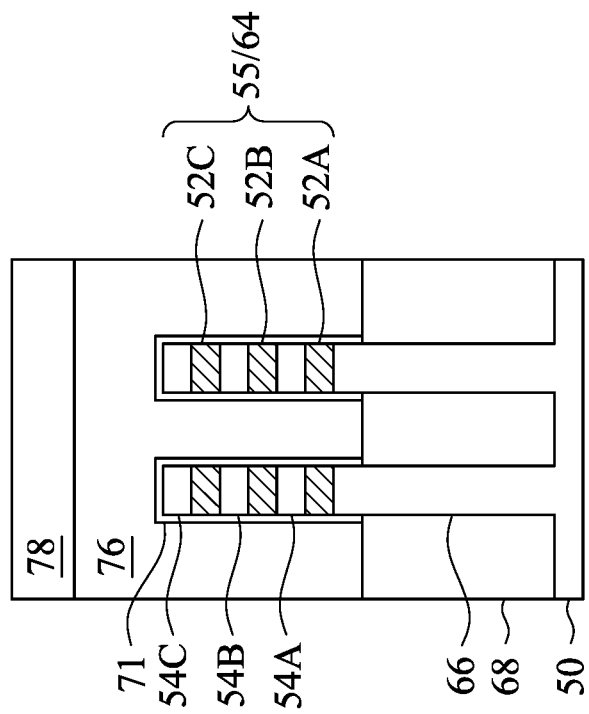
Figure 11C:
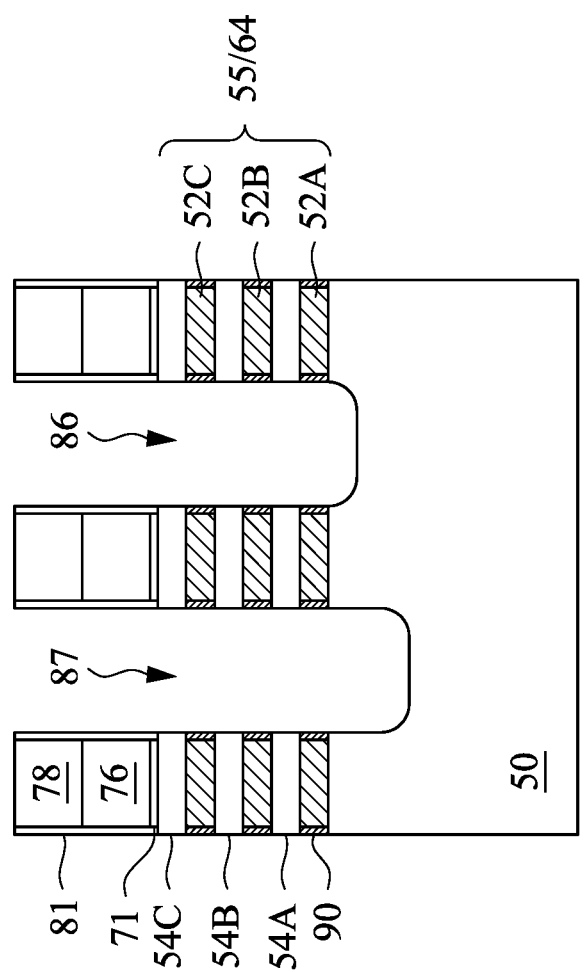
Figure 11D:
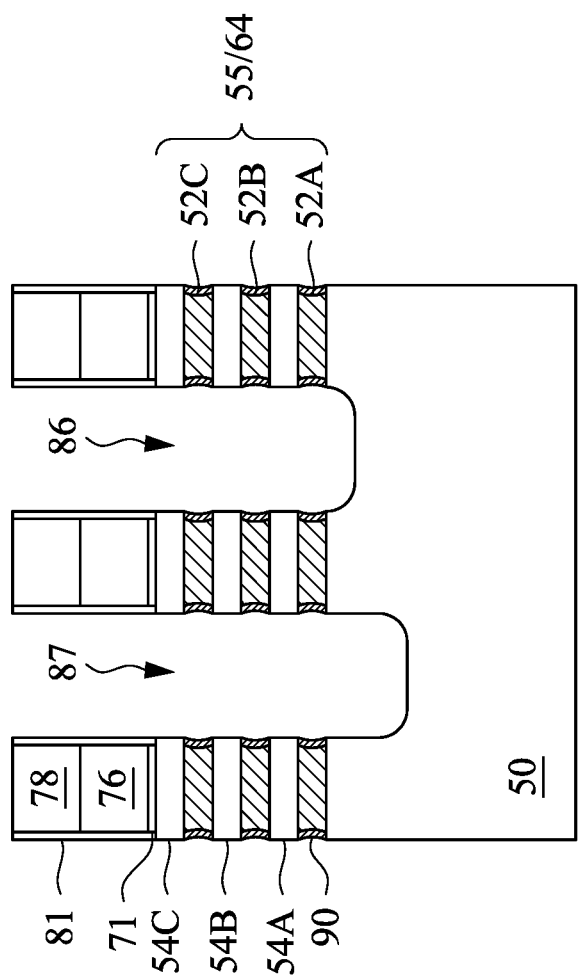

Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

In FIGS. 12A through 12E, first epitaxial materials 91 are formed in the second recesses 87 and epitaxial source/drain regions 92 are formed in the first recesses 86 and the second recesses 87. In some embodiments, the first epitaxial materials 91 in the second recesses 87 may be sacrificial materials, which are subsequently removed to form backside vias (such as the backside vias 130, discussed below with respect to FIGS. 26A through 26C). In some embodiments, the epitaxial source/drain regions 92 may exert stress on the second nanostructures 54 thereby improving performance.

Figure 12B:
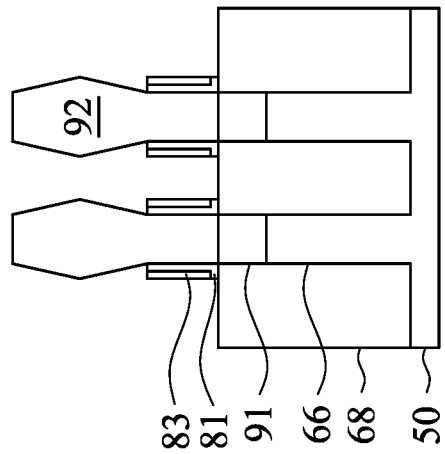
Figure 12A:
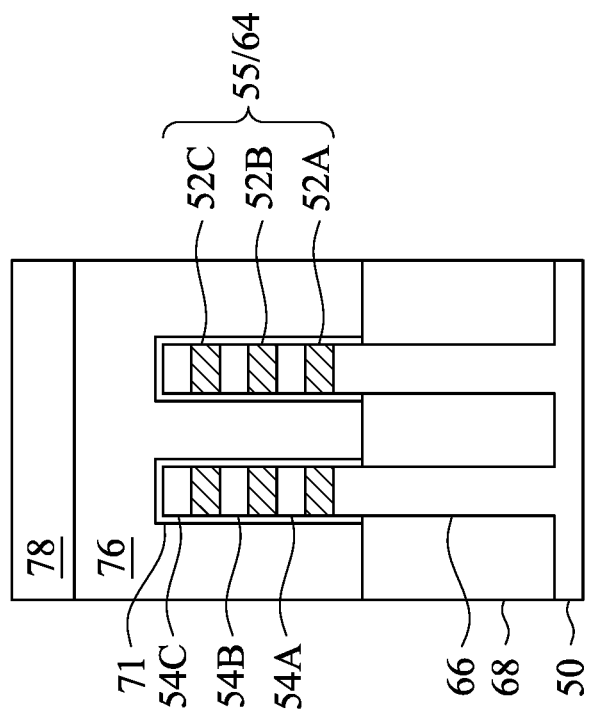
Figure 12D:
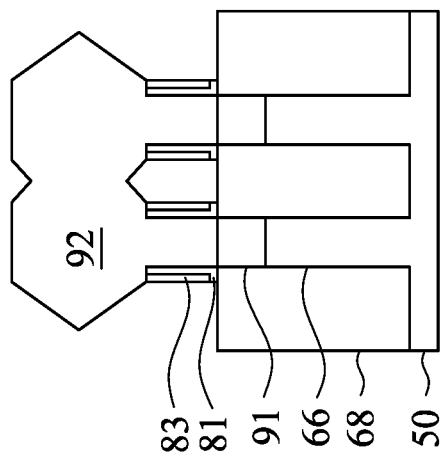
Figure 12C:
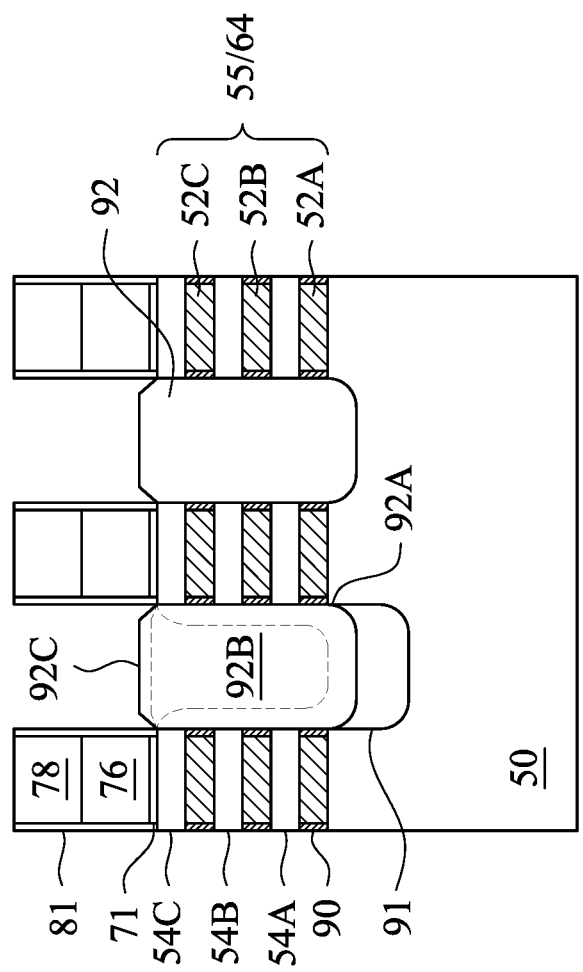

As illustrated in FIG. 12C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the first nanostructures 52 by an appropriate lateral distance so that the epitaxial source/drain regions 92 do not short out with subsequently formed gates of the resulting nano-FETs.

The first epitaxial materials 91 may be grown such that top surfaces of the first epitaxial materials 91 are level with bottom surfaces of the first recesses 86 (see FIGS. 11A through 11D) and top surfaces of the STI regions 68. However, in some embodiments, the top surfaces of the first epitaxial materials 91 may be disposed above or below the top surfaces of the STI regions 68. The first epitaxial materials 91 may be epitaxially grown in the second recesses 87 using a process such as CVD, ALD, VPE, MBE, or the like. The first epitaxial materials 91 may include any acceptable materials, such as silicon germanium or the like. The first epitaxial materials 91 may be formed of materials having a high etch selectivity to materials of the substrate 50, the epitaxial source/drain regions 92, and dielectric layers (such as the STI regions 68 and second dielectric layers 125, discussed below with respect to FIGS. 24A through 24C). As such, the first epitaxial materials 91 may be removed and replaced with backside vias without significantly removing the epitaxial source/drain regions 92, the substrate 50, or the STI regions 68.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epi- taxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the second nanostructures 54 are silicon, the epitaxial source/drain regions 92 may comprise materials exerting a compressive strain on the second nanostructures 54, such as silicon-germanium, boron doped silicon-germanium, germanium, germanium tin, or the like. The epitaxial source/drain regions 92 may also have surfaces raised from respective surfaces of the nanostructures 55 and may have facets.

The epitaxial source/drain regions 92, the first nanostructures 52, the second nanostructures 54, the fins 66 and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge, as illustrated by FIG. 12D. In other embodiments, adjacent epitaxial source/drain regions 92 remain separated after the epitaxy process is completed, as illustrated by FIG. 12B. In the embodiments illustrated in FIGS. 12B and 12D, the first spacers 81 may be formed extending to top surfaces of the STI regions 68, thereby blocking the epitaxial growth. In some embodiments, the spacer etch used to form the first spacers 81 may be adjusted to remove the spacer material and allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12E:
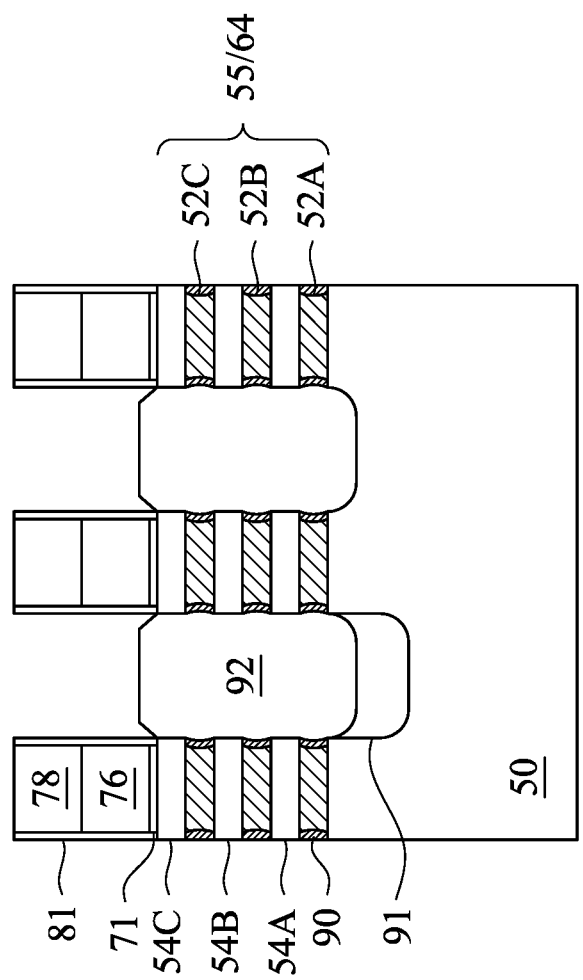

FIG. 12E illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12E, the epitaxial source/drain regions 92 may be formed in contact with the first inner spacers 90 and may extend past sidewalls of the second nanostructures 54.

Figure 13B:
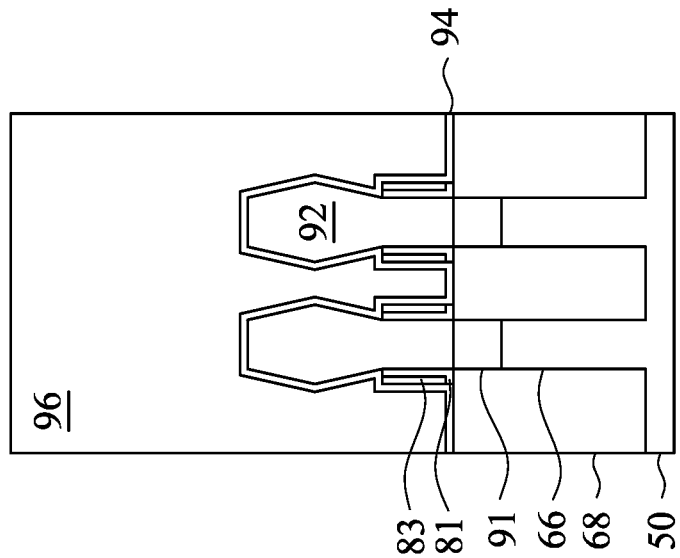
Figure 13A:
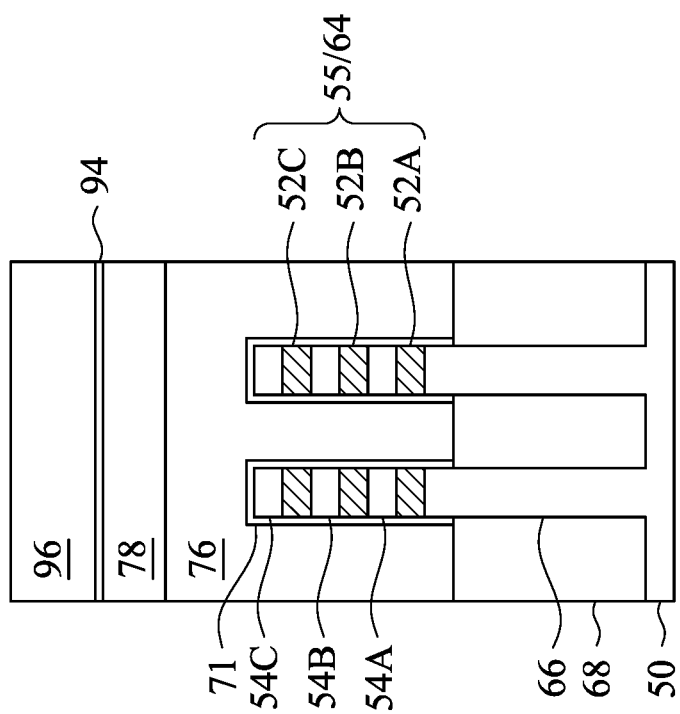
Figure 13C:
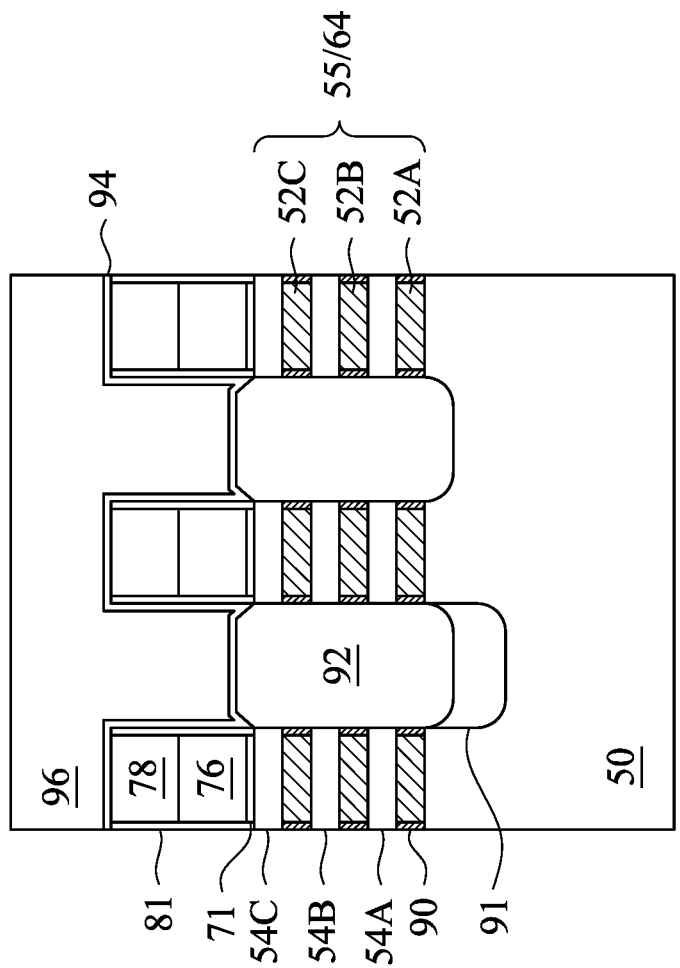

In FIGS. 13A through 13C, a first interlayer dielectric (ILD) 96 is deposited over the structure illustrated in FIGS. 12A through 12C, respectively. The first ILD 96 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, the first spacers 81, the second spacers 83, and the STI regions 68. The CESL 94 may comprise a dielectric material, such as, silicon nitride, silicon oxide, silicon oxynitride, or the like, having a different etch rate than the material of the overlying first ILD 96.

Figure 14B:
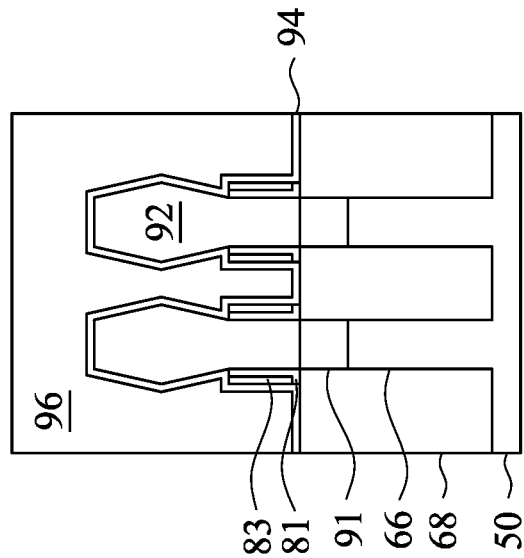
Figure 14A:
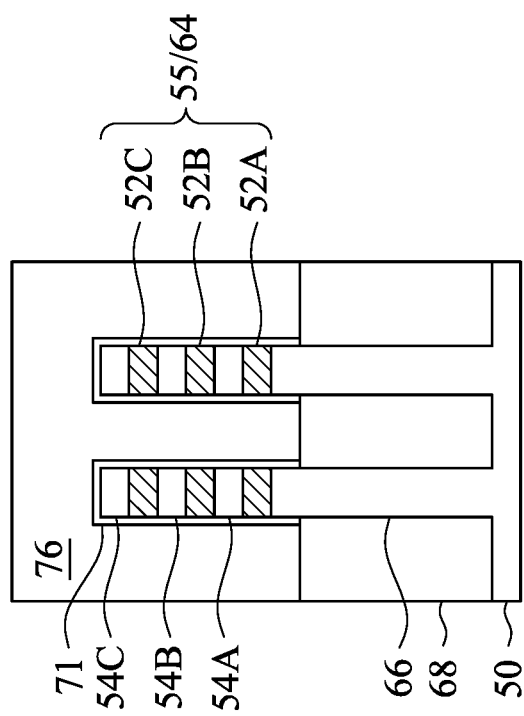
Figure 14C:
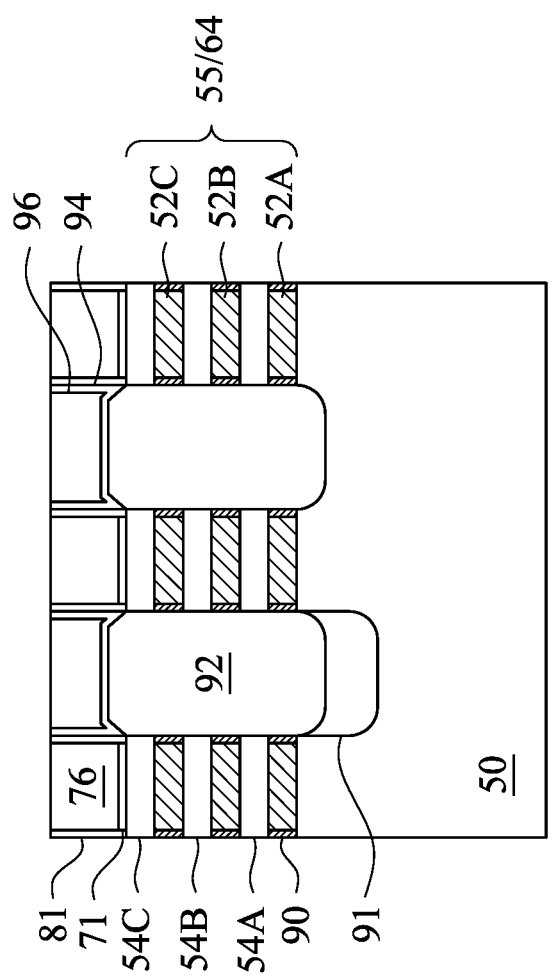

In FIGS. 14A through 14C, a planarization process, such as a CMP, may be performed to level the top surfaces of the first ILD 96 and the CESL 94 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, the first ILD 96, and the CESL 94 may be level with one another, within process variations.

Accordingly, the top surfaces of the dummy gates 76 are exposed through the first ILD 96. In some embodiments, the masks 78 may remain, in which case the planarization process levels top surfaces of the first ILD 96 with top surfaces of the masks 78, the first spacers 81, and the CESL 94.

Figure 15B:
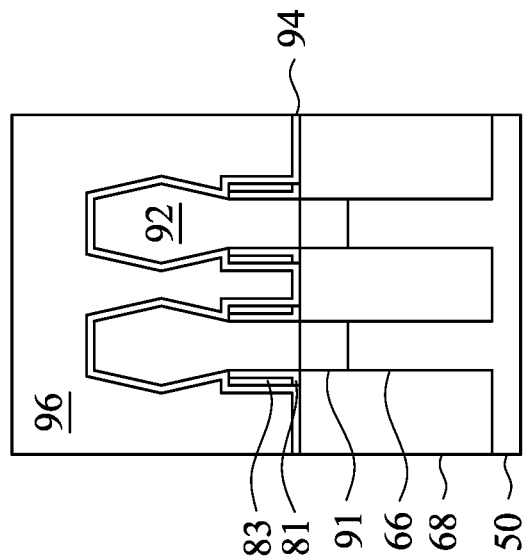
Figure 15A:
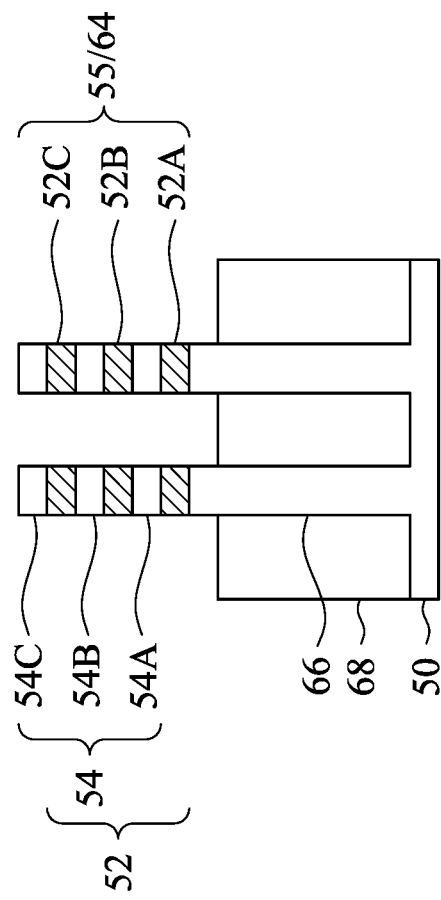
Figure 15C:
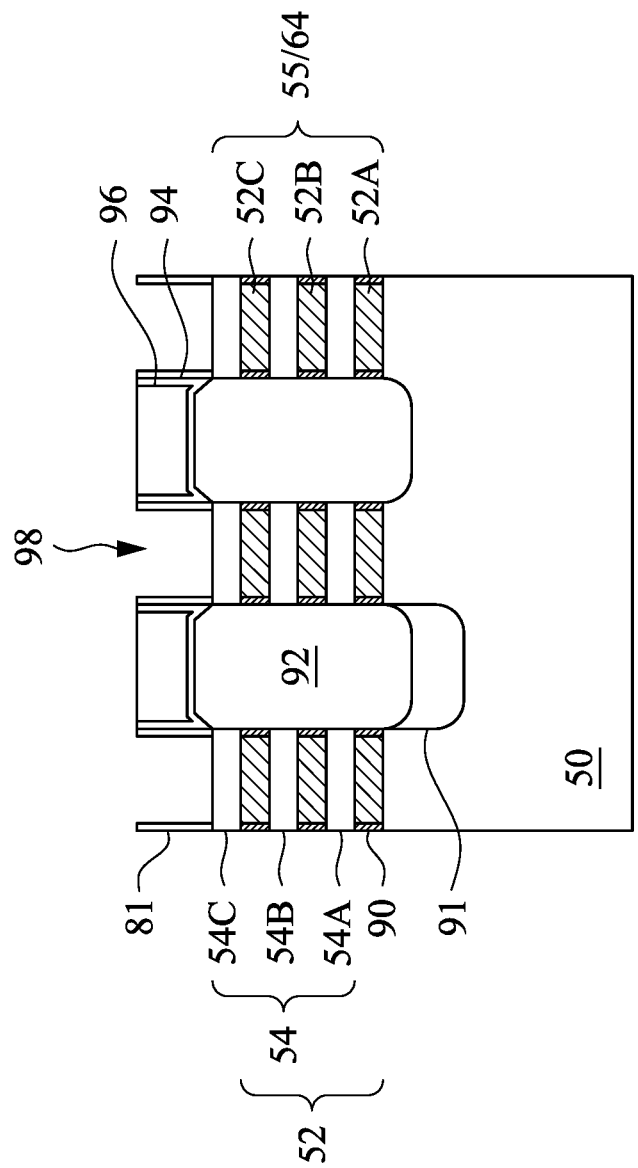

In FIGS. 15A through 15C, the dummy gates 76, and the masks 78 if present, are removed in one or more etching steps, forming third recesses 98. Portions of the dummy gate dielectrics 71 in the third recesses 98 are also removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96, the CESL 94, or the first spacers 81. Each of the third recesses 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16B:
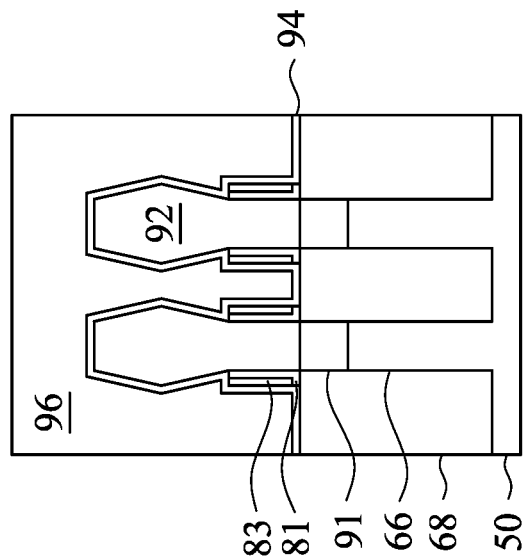
Figure 16A:
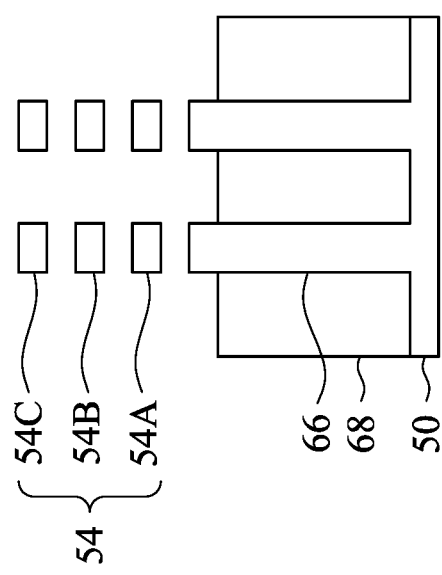
Figure 16C:
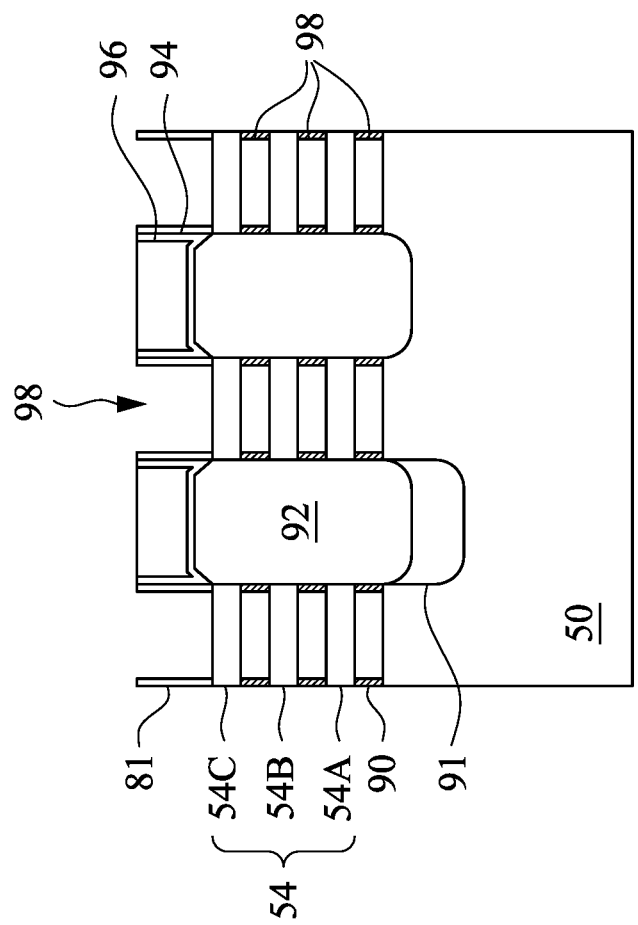

In FIGS. 16A through 16C, the first nanostructures 52 are removed extending the third recesses 98. The first nanostructures 52 may be removed by performing an isotropic etching process, such as wet etching or the like, using etchants which are selective to the materials of the first nanostructures 52, while the second nanostructures 54, the substrate 50, the STI regions 68, the first ILD 96, the CESL 94, the first spacers 81, and the first inner spacers 90 remain relatively un-etched as compared to the first nanostructures 52. In embodiments in which the second nanostructures 54 include, e.g., Si or SiC, and the first nanostructures 52 include, e.g., SiGe, tetramethylammonium hydroxide (TMAH), ammonium hydroxide ($NH_4OH$), or the like may be used to remove the first nanostructures 52.

Figure 17B:
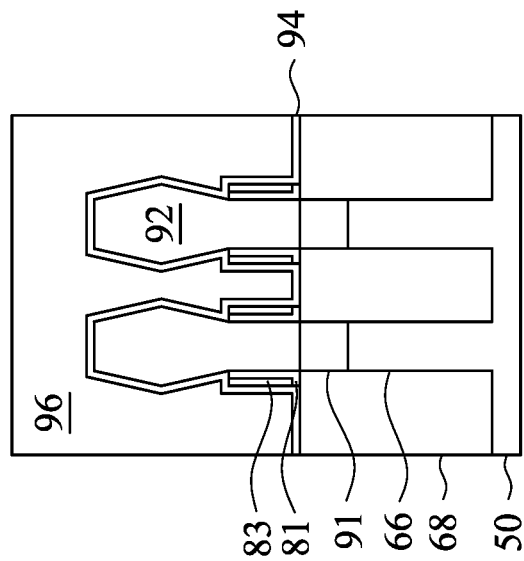
Figure 17A:
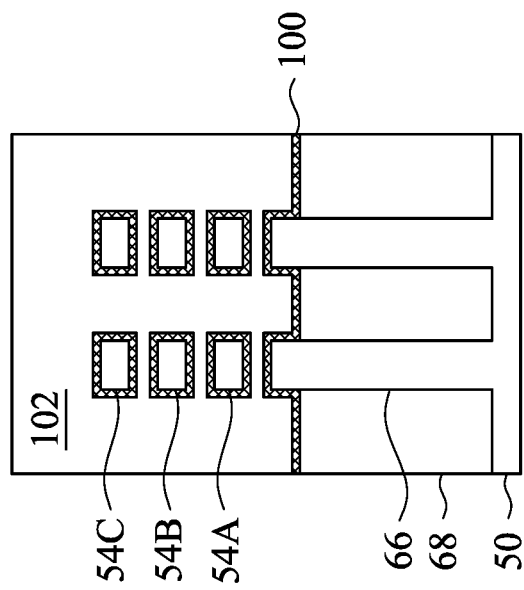
Figure 17C:
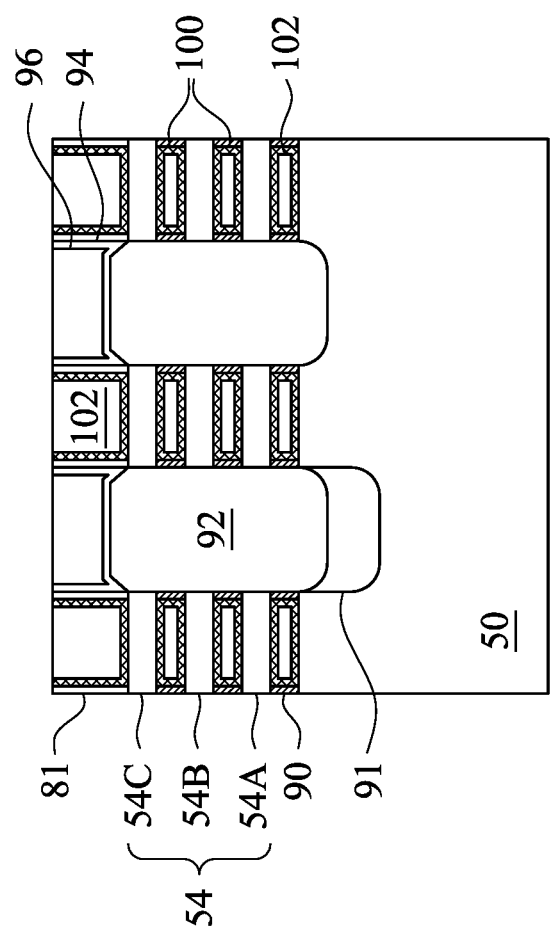

In FIGS. 17A through 17C, gate dielectric layers 100 and gate electrodes 102 are formed for replacement gates. The gate dielectric layers 100 are deposited conformally in the third recesses 98. The gate dielectric layers 100 may be formed on top surfaces, sidewalls, and bottom surfaces of the second nanostructures 54. The gate dielectric layers 100 may also be deposited on top surfaces of the first ILD 96, the CESL 94, the first spacers 81, and the STI regions 68.

In accordance with some embodiments, the gate dielectric layers 100 comprise one or more dielectric layers, such as an oxide, a metal oxide, the like, or combinations thereof. For example, in some embodiments, the gate dielectric layers 100 may comprise a silicon oxide layer and a metal oxide layer over the silicon oxide layer. In some embodiments, the gate dielectric layers 100 include a high-k dielectric material, and in these embodiments, the gate dielectric layers 100 may have a k-value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, or the like.

The gate electrodes 102 are deposited over the gate dielectric layers 100, and fill remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single-layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited between adjacent ones of the second nanostructures 54.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surfaces of the first ILD 96, the first spacers 81, and the CESL 94. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18B:
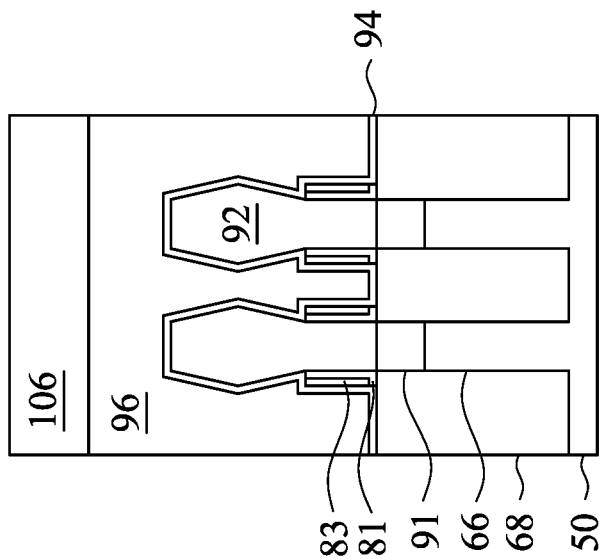
Figure 18A:
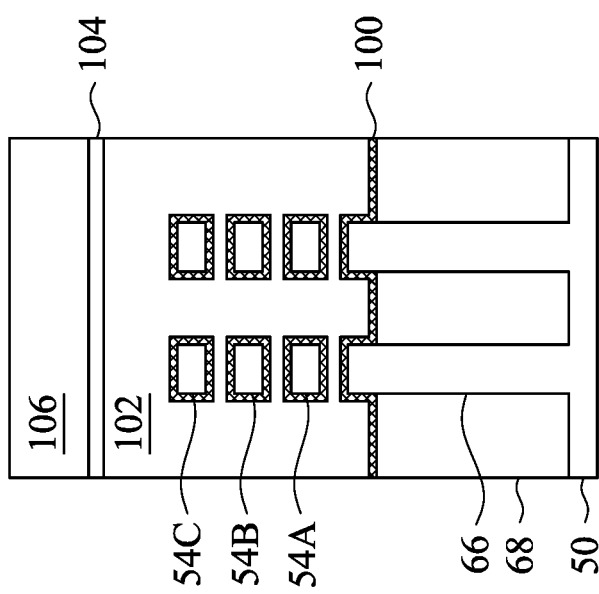
Figure 18C:
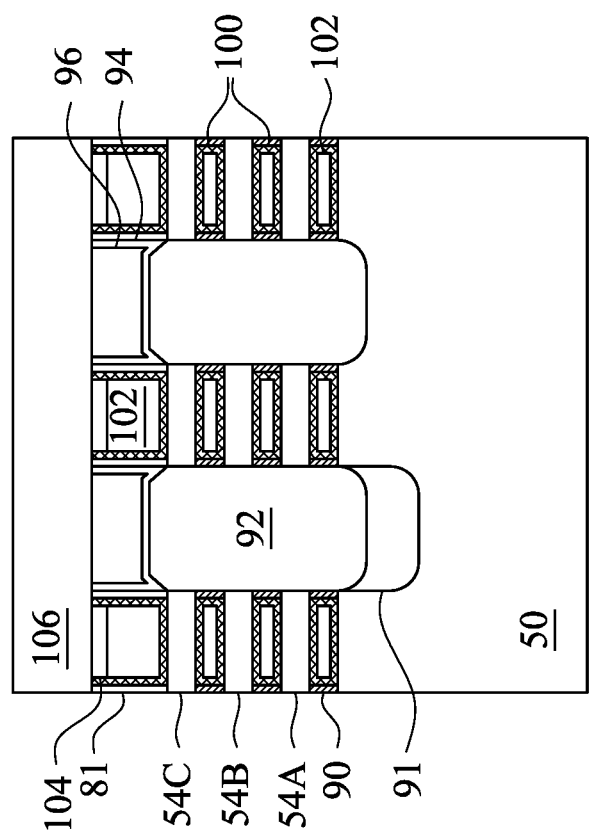

In FIGS. 18A through 18C, the gate structures (including the gate dielectric layers 100 and the corresponding overlying gate electrodes 102) are recessed, so that recesses are formed directly over each of the gate structures and between opposing portions of the first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96, the CESL 94, and the first spacers 81. Subsequently formed gate contacts (such as the gate contacts 114, discussed below with respect to FIGS. 20A and 20C) penetrate through the gate masks 104 to contact the top surface of the recessed gate electrodes 102.

As further illustrated by FIGS. 18A through 18C, a second ILD 106 is deposited over the first ILD 96, the CESL 94, and the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
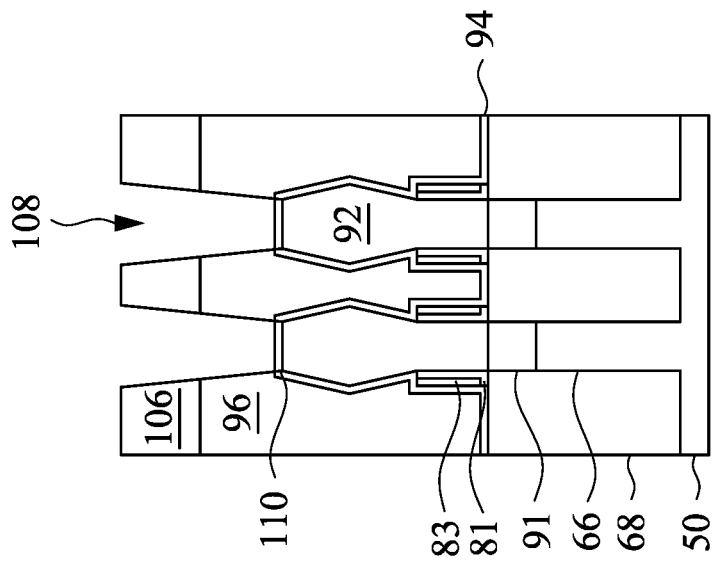
Figure 19A:
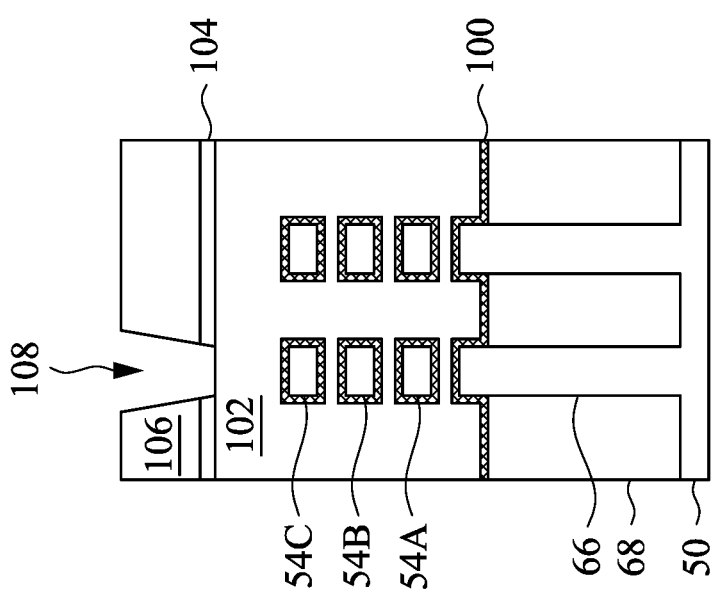
Figure 19C:
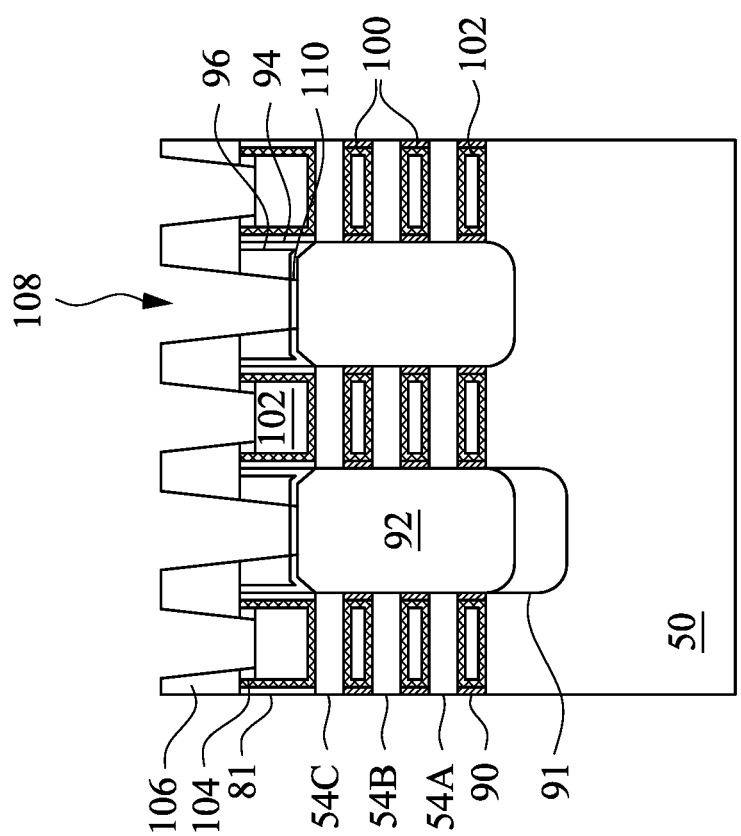

In FIGS. 19A through 19C, the second ILD 106, the first ILD 96, the CESL 94, and the gate masks 104 are etched to form fourth recesses 108 exposing surfaces of the epitaxial source/drain regions 92 and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 may extend into the epitaxial source/drain regions 92 and/or the gate structures. Bottom surfaces of the fourth recesses 108 may be level with (e.g., at a same level, or having a same distance from the substrate 50), or lower than (e.g., closer to the substrate 50) top surfaces of the epitaxial source/drain regions 92 and/or the gate structures. Although FIG. 19C illustrates the fourth recesses 108 as exposing the epitaxial source/drain regions 92 and the gate structures in a same cross-section, in some embodiments, the epitaxial source/drain regions 92 and the gate structures may be exposed in different cross-sections, thereby reducing the risk of shorting subsequently formed contacts.

After the fourth recesses 108 are formed, first silicide regions 110 are formed over the epitaxial source/drain regions 92. In some embodiments, the first silicide regions 110 are formed by first depositing a metal (not separately illustrated) capable of reacting with the semiconductor materials of the underlying epitaxial source/drain regions 92 (e.g., silicon, silicon germanium, germanium, or the like) to form silicide or germanide regions. The metal may include nickel, cobalt, titanium, tantalum, platinum, tungsten, other noble metals, other refractory metals, rare earth metals or their alloys. The metal may be deposited over the exposed portions of the epitaxial source/drain regions 92, then a thermal anneal process may be performed to form the first silicide regions 110. The unreacted portions of the deposited metal are then removed by, e.g., an etching process. Although the first silicide regions 110 are referred to as silicide regions, the first silicide regions 110 may also be germanide regions, or silicon germanide regions (e.g., regions comprising silicon and germanium), or the like. In an embodiment, the first silicide regions 110 comprise TiSi, and have thicknesses ranging from about 2 nm to about 10 nm.

Figure 20B:
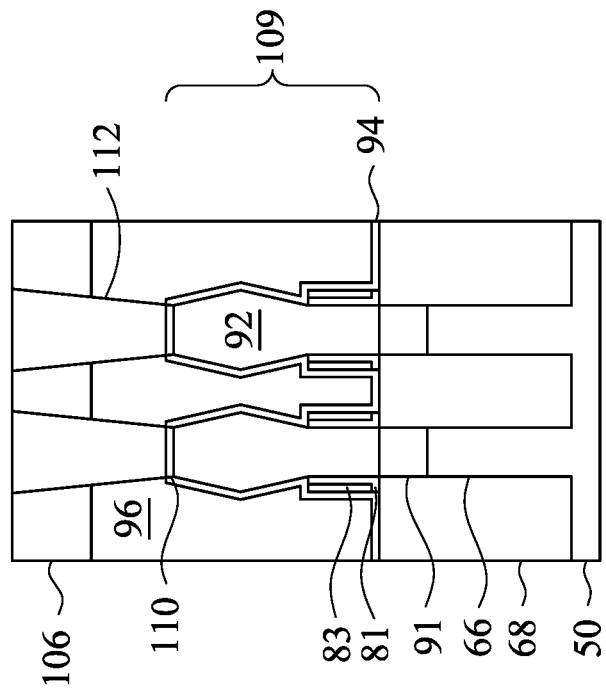
Figure 20A:
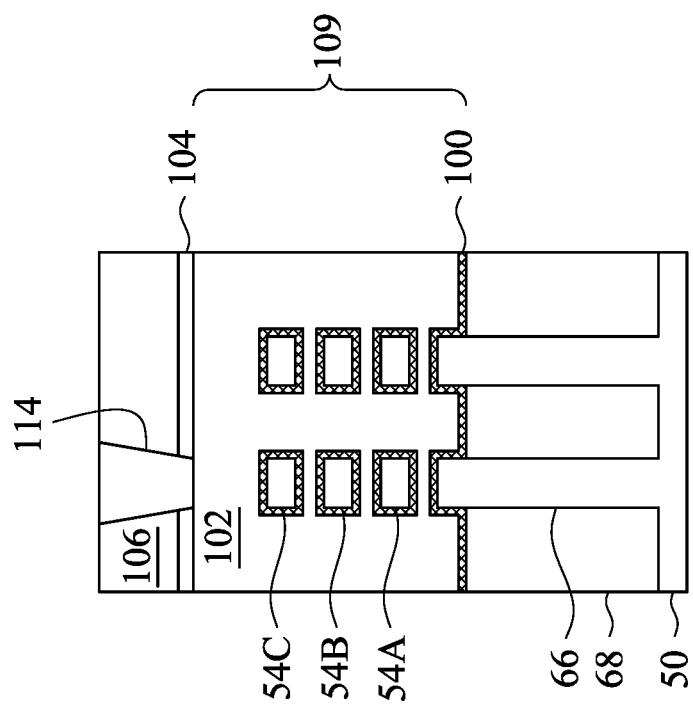
Figure 20C:
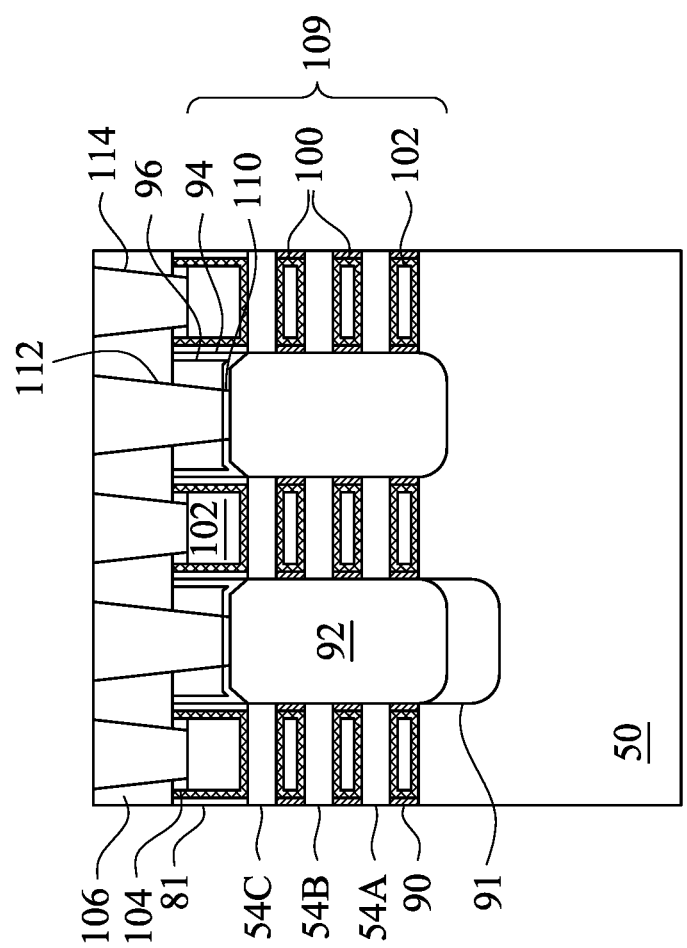

In FIGS. 20A through 20C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material. The source/drain contacts 112 and the gate contacts 114 are each electrically coupled to the underlying conductive feature (e.g., the gate electrodes 102 or the first silicide regions 110 over the epitaxial source/drain regions 92 in the illustrated embodiment). The gate contacts 114 are electrically coupled to the gate electrodes 102, and the source/drain contacts 112 are electrically coupled to the first silicide regions 110 over the epitaxial source/drain regions 92. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess portions of the source/drain contacts 112 and the gate contacts 114, which excess portions are over top surfaces of the second ILD 106.

The epitaxial source/drain regions 92, the second nanostructures 54, and the gate structures (including the gate dielectric layers 100 and the gate electrodes 102) may collectively be referred to as transistor structures 109. A first interconnect structure (such as the front-side interconnect structure 120, discussed below with respect to FIGS. 21A through 21C) may be formed over front-sides of the transistor structures 109 and a second interconnect structure (such as the backside interconnect structure 140, discussed below with respect to FIGS. 27A through 27C) may be formed over backsides of the transistor structures 109. Although the transistor structures 109 are described as including nano-FETs, other embodiments may include transistor structures 109 with different types of transistors (e.g., planar FETs, FinFETs, thin film transistors (TFTs), or the like).

Although FIGS. 20A through 20C illustrate a source/drain contact 112 extending to each of the epitaxial source/drain regions 92, the source/drain contacts 112 may be omitted from certain ones of the epitaxial source/drain regions 92. For example, as explained in greater detail below, conductive features (e.g., backside vias or power rails) may be subsequently attached through backsides of one or more of the epitaxial source/drain regions 92. For these particular epitaxial source/drain regions 92, the source/drain contacts 112 may be omitted or may be dummy contacts that are not electrically connected to any overlying conductive lines (such as the first conductive features 122, discussed below with respect to FIGS. 21A through 21C).

FIGS. 21A through 27C illustrate intermediate steps of forming front-side interconnect structures and backside interconnect structures on the transistor structures 109. The front-side interconnect structures and the backside interconnect structures may each comprise conductive features that are electrically connected to the transistor structures 109 (e.g., the nano-FETs). In FIGS. 21A through 27C, figures ending in "A" illustrate a cross-sectional view along line A-A' of FIG. 1, figures ending in "B" illustrate a cross-sectional view along line B-B' of FIG. 1, and figures ending in "C" illustrate a cross-sectional view along line C-C' of FIG. 1. The process steps described in FIGS. 21A through 27C may be applied to both the n-type region 50N and the p-type region 50P. As noted above, a back-side conductive feature (e.g., a backside via or a power rail) may be connected to one or more of the epitaxial source/drain regions 92. As such, the source/drain contacts 112 may be optionally omitted from the epitaxial source/drain regions 92.

Figure 21B:
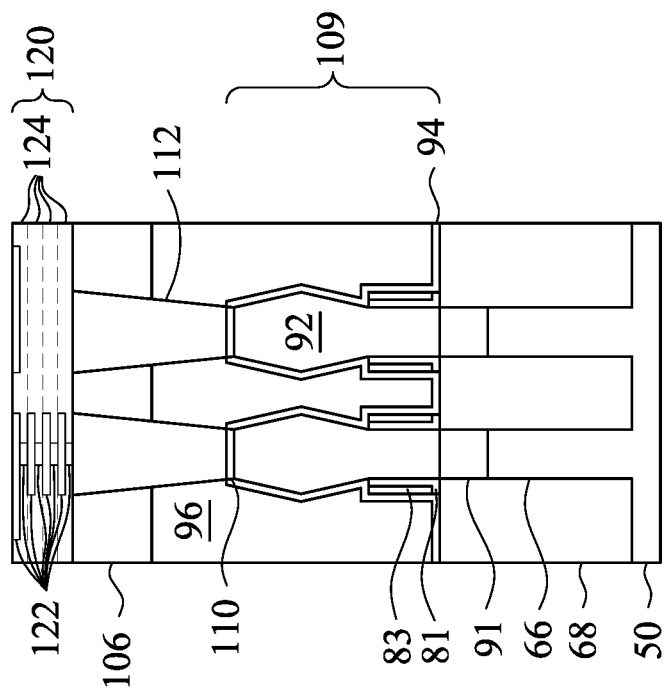
Figure 21A:
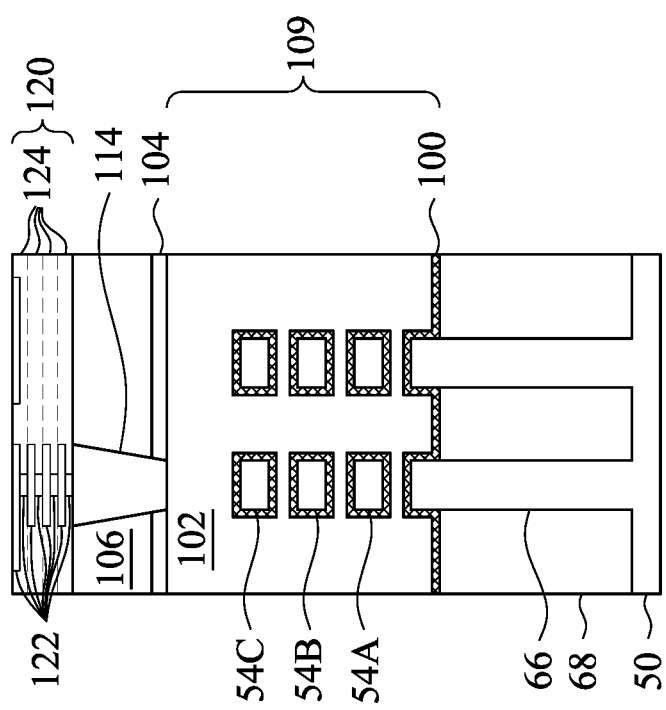
Figure 21C:
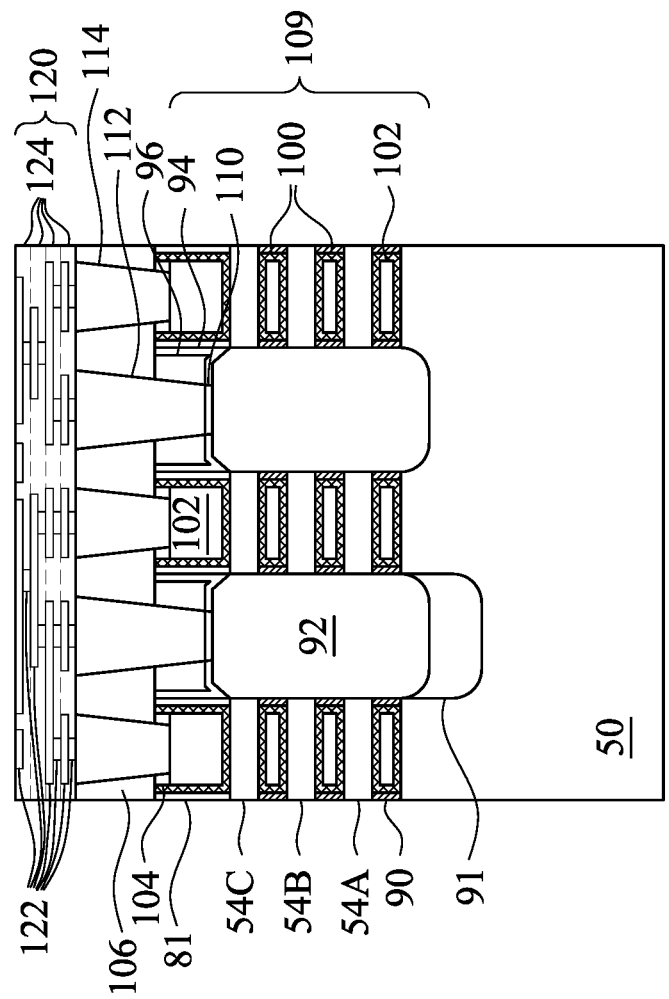

In FIGS. 21A through 21C, a front-side interconnect structure 120 is formed on the second ILD 106. The front-side interconnect structure 120 may be referred to as a front-side interconnect structure because it is formed on a front-side of the transistor structures 109 (e.g., a side of the transistor structures opposite the substrate 50 on which the transistor structures 109 are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, cobalt, tungsten, ruthenium, combinations thereof, or the like. In an embodiment, the first conductive features 122 may be formed by depositing a seed layer of copper or a copper alloy, and filling the trenches by electroplating. A CMP process or the like may be used to remove excess conductive material from a surface of the respective first dielectric layer 124 and to planarize surfaces of the first dielectric layer 124 and the first conductive features 122 for subsequent processing.

FIGS. 21A through 21C illustrate four layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 22B:
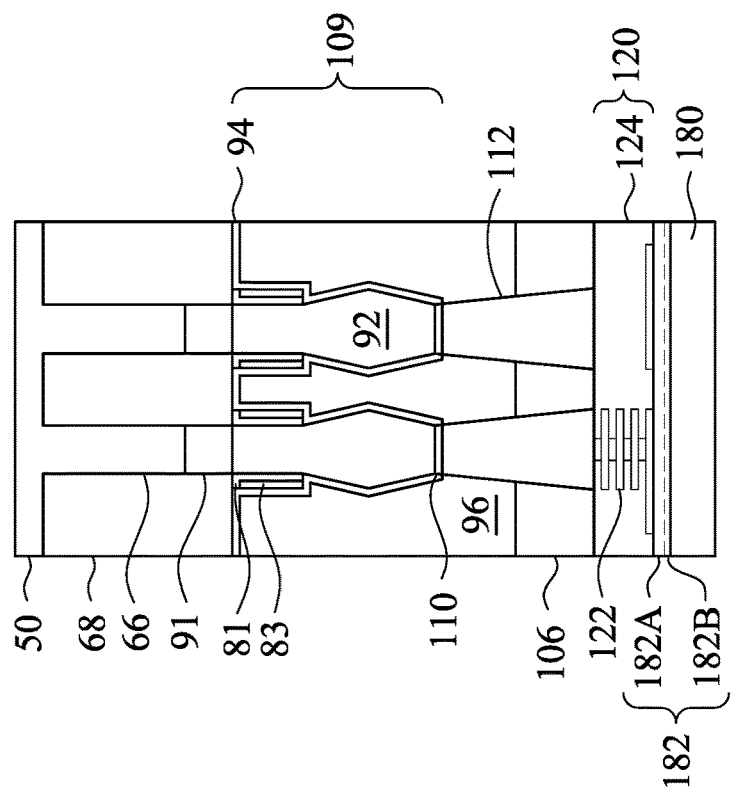
Figure 22A:
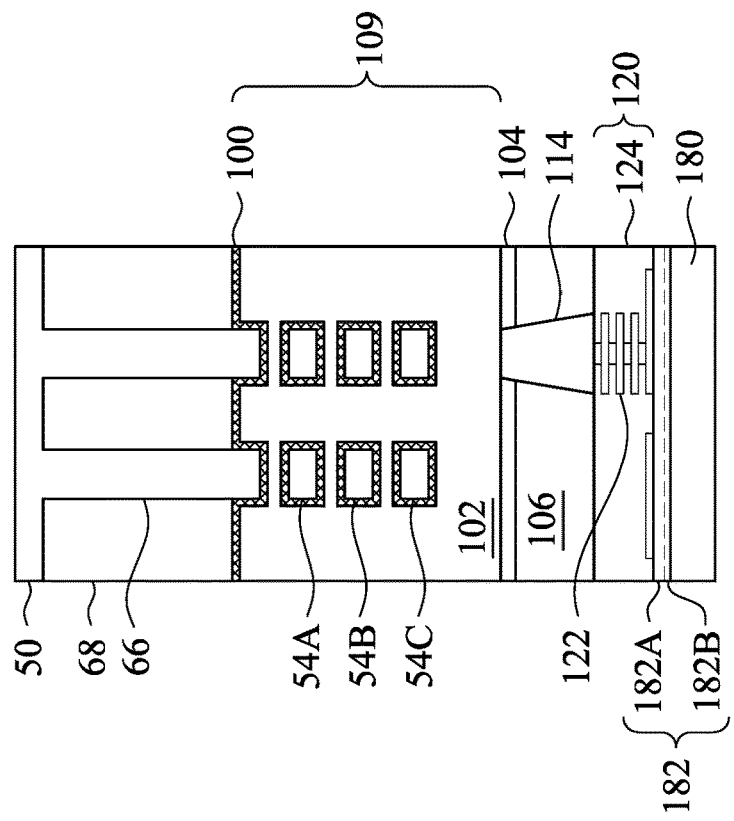
Figure 22C:
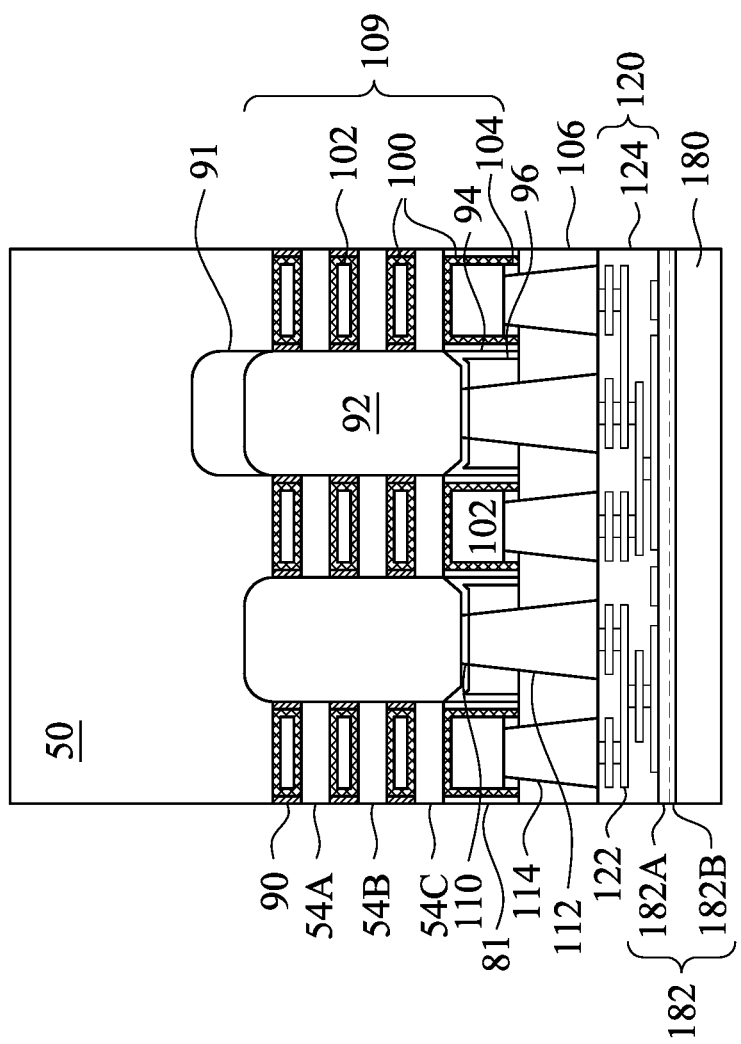

In FIGS. 22A through 22C, a carrier substrate 180 is bonded to a top surface of the front-side interconnect structure 120 by a first bonding layer 182A and a second bonding layer 182B (collectively referred to as bonding layers 182). The carrier substrate 180 may be a glass carrier substrate, a ceramic carrier substrate, a wafer (e.g., a silicon wafer), or the like. The carrier substrate 180 may provide structural support during subsequent processing steps and in the completed device.

In various embodiments, the carrier substrate 180 may be bonded to the front-side interconnect structure 120 using a suitable technique, such as dielectric-to-dielectric bonding, or the like. The dielectric-to-dielectric bonding may comprise depositing the first bonding layer 182A on the front-side interconnect structure 120. In some embodiments, the first bonding layer 182A comprises silicon oxide (e.g., a high-density plasma (HDP) oxide, or the like) that is deposited by CVD, ALD, PVD, or the like. The second bonding layer 182B may likewise be an oxide layer that is formed on a surface of the carrier substrate 180 prior to bonding using, for example, CVD, ALD, PVD, thermal oxidation, or the like. Other suitable materials may be used for the first bonding layer 182A and the second bonding layer 182B.

The dielectric-to-dielectric bonding process may further include applying a surface treatment to one or more of the first bonding layer 182A and the second bonding layer 182B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 182. The carrier substrate 180 is then aligned with the front-side interconnect structure 120 and the two are pressed against each other to initiate a pre-bonding of the carrier substrate 180 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 180 to a temperature of about 170° C.

Further in FIGS. 22A through 22C, after the carrier substrate 180 is bonded to the front-side interconnect structure 120, the device may be flipped such that a backside of the transistor structures 109 faces upwards. The backside of the transistor structures 109 may refer to a side opposite to the front-side of the transistor structures 109.

Figure 23B:
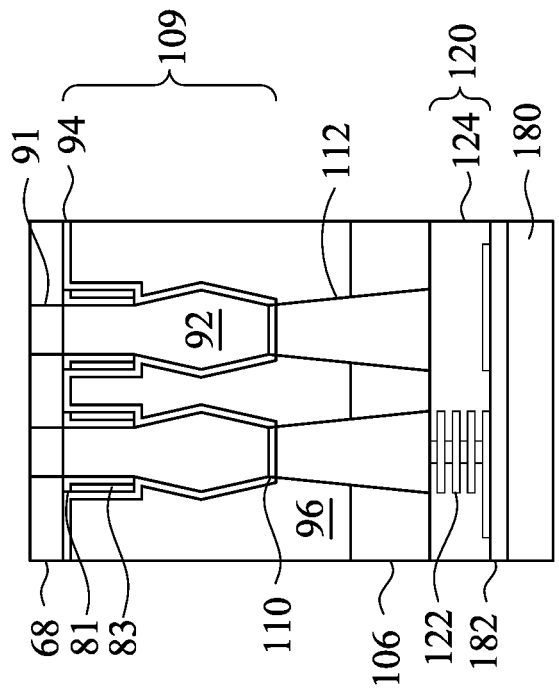
Figure 23A:
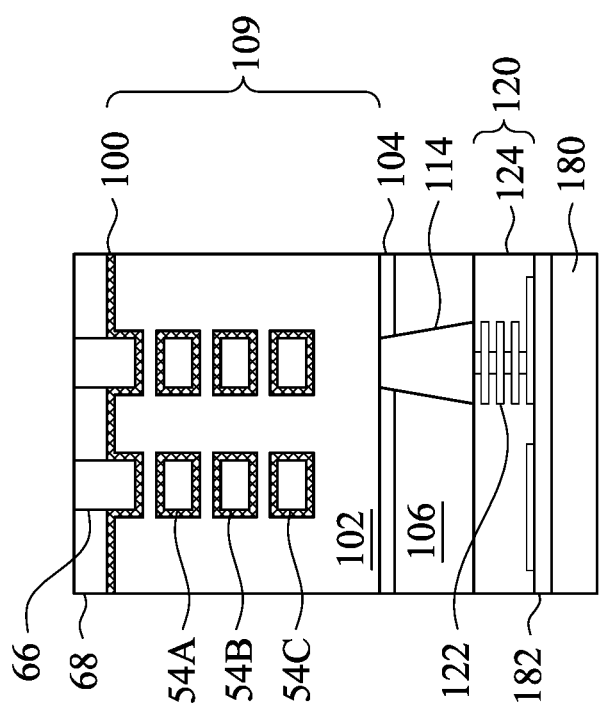
Figure 23C:
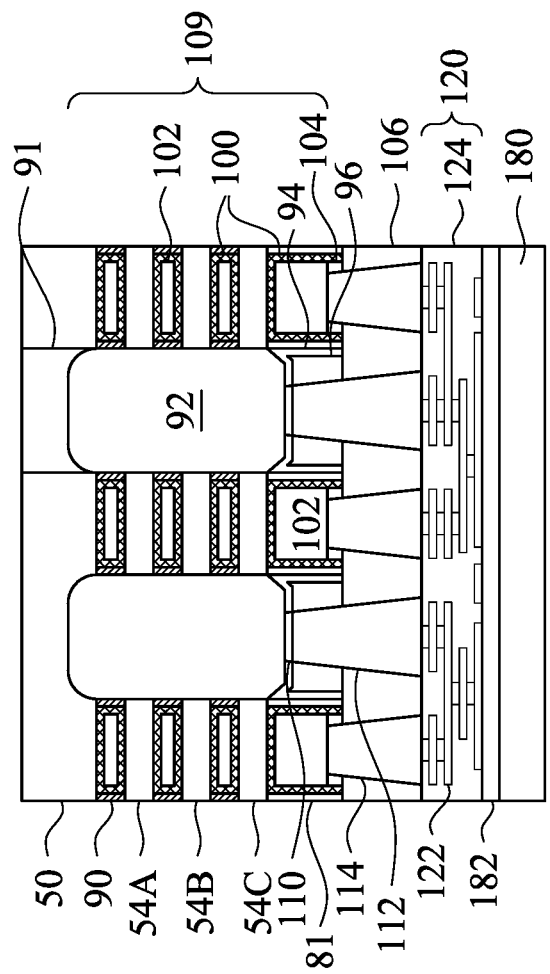

In FIGS. 23A through 23C, a thinning process is applied to the backside of the substrate 50. The thinning process may comprise a planarization process (e.g., a mechanical grinding, a CMP, or the like), an etch-back process, a combination thereof, or the like. The thinning process may expose surfaces of the first epitaxial materials 91 opposite the front-side interconnect structure 120. Further, a portion of the substrate 50 may remain over the transistor structures 109 after the thinning process. As illustrated in FIGS. 23A through 23C, backside surfaces of the substrate 50, the first epitaxial materials 91, the STI regions 68, and the fins 66 may be level with one another following the thinning process.

Figure 24B:
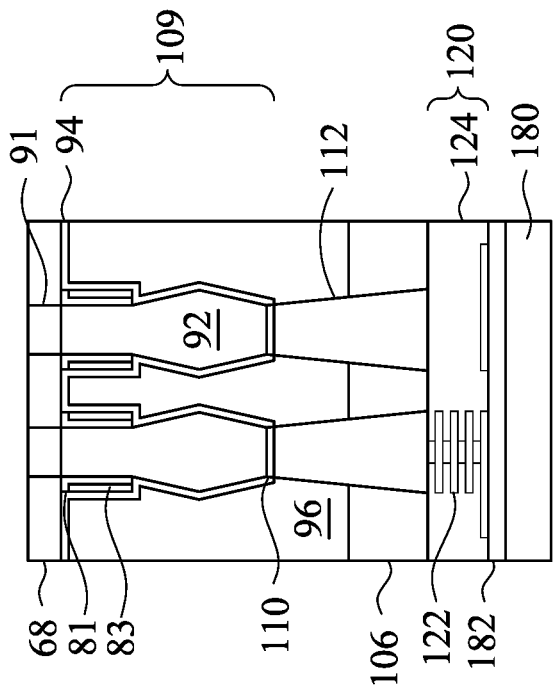
Figure 24A:
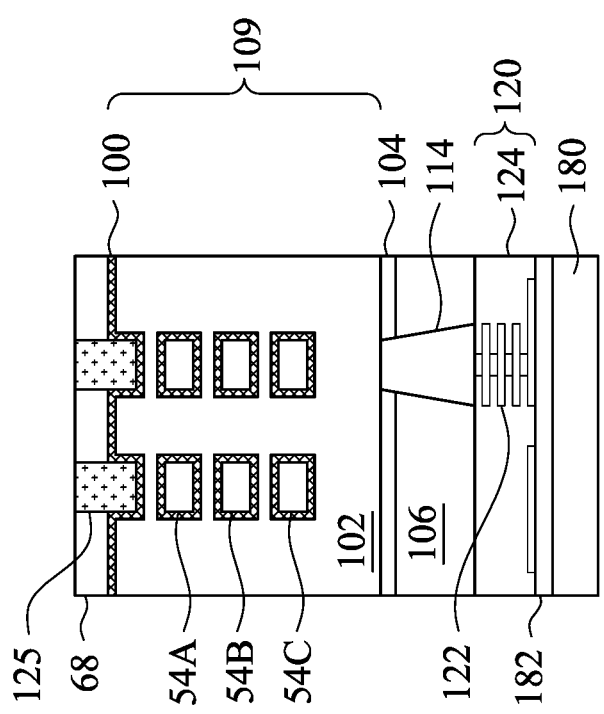
Figure 24C:
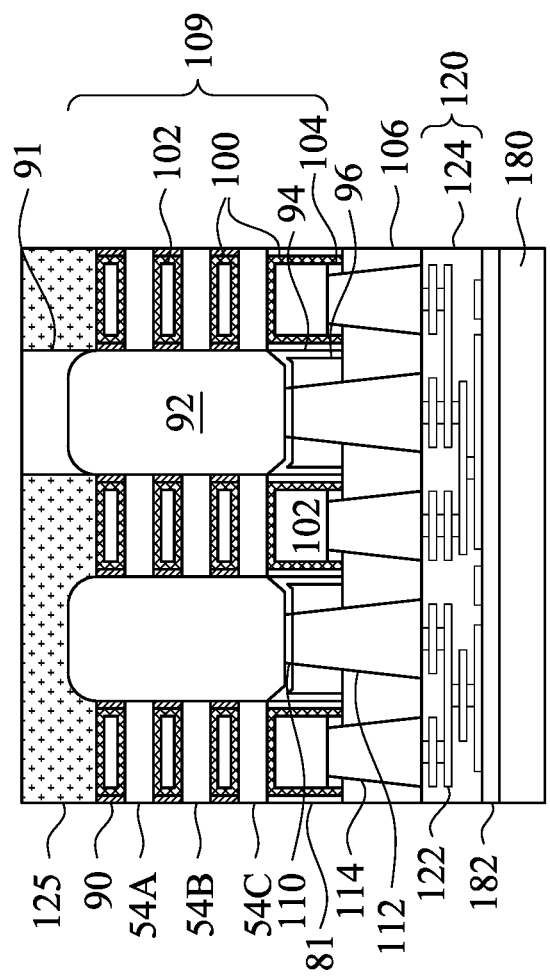

In FIGS. 24A through 24C, remaining portions of the fins 66 and the substrate 50 are removed and replaced with a second dielectric layer 125. The fins 66 and the substrate 50 may be etched using a suitable etching process, such as an isotropic etching process (e.g., a wet etching process), an anisotropic etching process (e.g., a dry etching process), or the like. The etching process may be one that is selective to the material of the fins 66 and the substrate 50 (e.g., etches the material of the fins 66 and the substrate 50 at a faster rate than the material of the STI regions 68, the gate dielectric layers 100, the epitaxial source/drain regions 92, the first epitaxial materials 91, and the first inner spacers 90). After etching the fins 66 and the substrate 50, surfaces of the STI regions 68, the gate dielectric layers 100, the epitaxial source/drain regions 92, the first epitaxial materials 91, and the first inner spacers 90 may be exposed.

The second dielectric layer 125 is then deposited on the backside of the transistor structures 109 in recesses formed by removing the fins 66 and the substrate 50. The second dielectric layer 125 may be deposited over the STI regions 68, the gate dielectric layers 100, the epitaxial source/drain regions 92, the first epitaxial materials 91, and the first inner spacers 90. The second dielectric layer 125 may physically contact surfaces of the STI regions 68, the gate dielectric layers 100, the epitaxial source/drain regions 92, the first epitaxial materials 91, and the first inner spacers 90. The second dielectric layer 125 may be substantially similar to the second ILD 106, described above with respect to FIGS. 18A through 18C. For example, the second dielectric layer 125 may be formed of a like material and using a like process as the second ILD 106. As illustrated in FIGS. 24A through 24C, a CMP process or the like may be used to remove material of the second dielectric layer 125 such that top surfaces of the second dielectric layer 125 are level with top surfaces of the STI regions 68 and the first epitaxial materials 91.

Figure 25B:
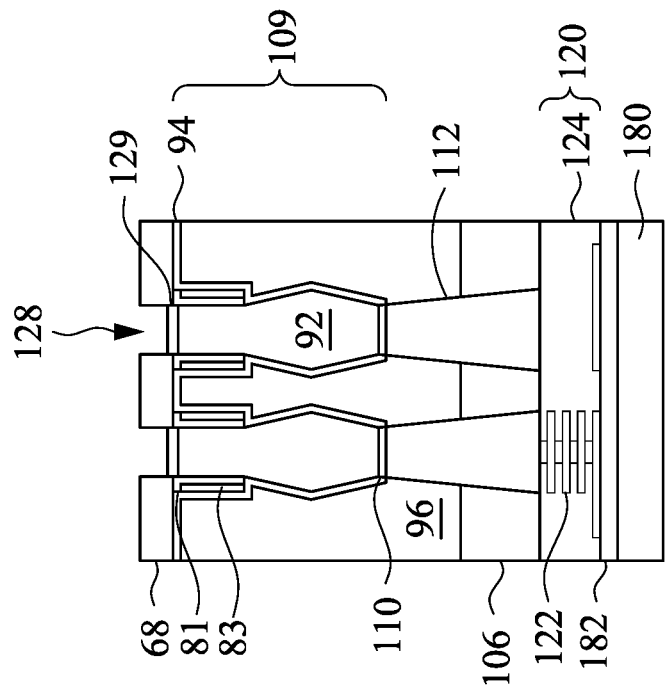
Figure 25A:
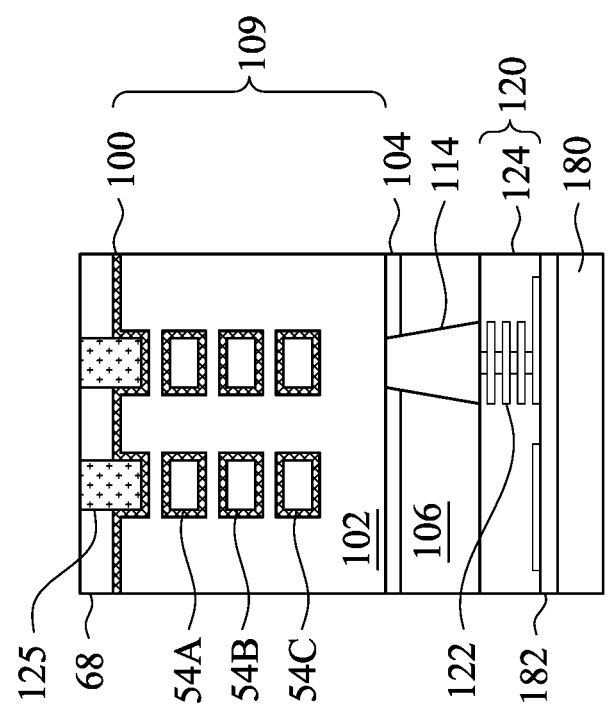
Figure 25C:
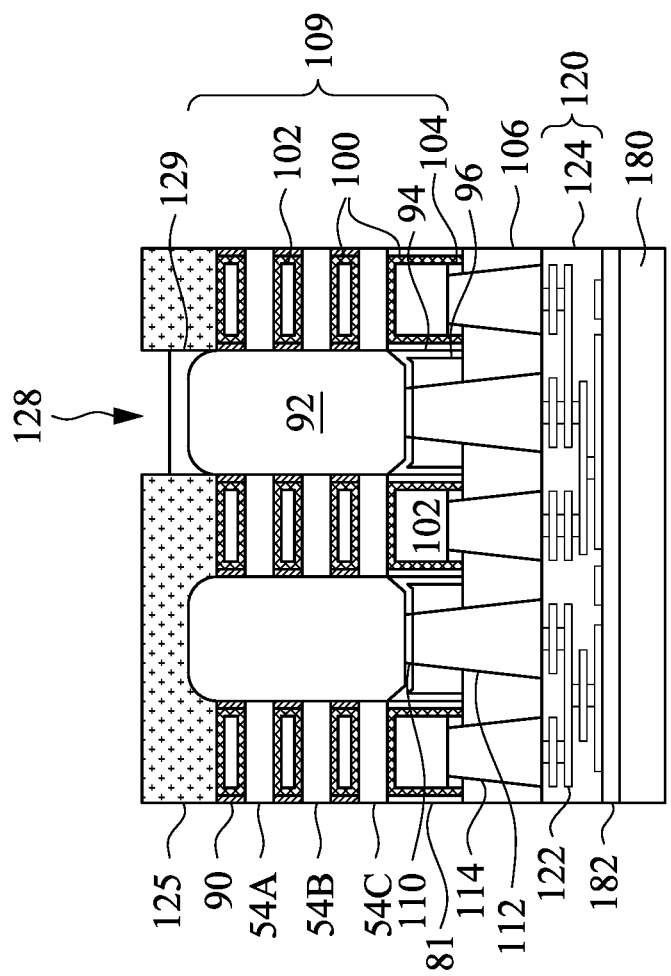

In FIGS. 25A through 25C, the first epitaxial materials 91 are removed to form fifth recesses 128 and second silicide regions 129 are formed in the fifth recesses 128. The first epitaxial materials 91 may be removed by a suitable etching process, which may be an isotropic etching process, such as a wet etching process. The etching process may have a high etch selectivity to materials of the first epitaxial materials 91. As such, the first epitaxial materials 91 may be removed without significantly removing materials of the second dielectric layer 125, the STI regions 68, or the epitaxial source/drain regions 92. The fifth recesses 128 may expose sidewalls of the STI regions 68, backside surfaces of the epitaxial source/drain regions 92, and sidewalls of the second dielectric layer 125.

Second silicide regions 129 may then be formed in the fifth recesses 128 on backsides of the epitaxial source/drain regions 92. The second silicide regions 129 may be similar to the first silicide regions 110, described above with respect to FIGS. 19A through 19C. For example, the second silicide regions 129 may be formed of a like material and using a like process as the first silicide regions 110.

Figure 26B:
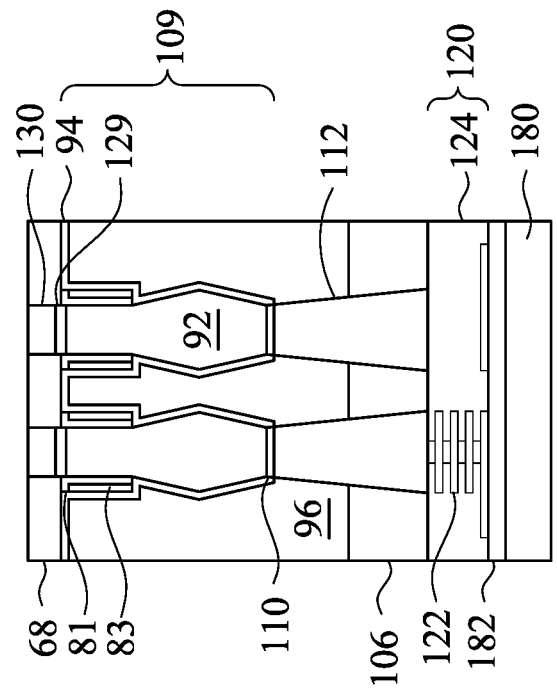
Figure 26A:
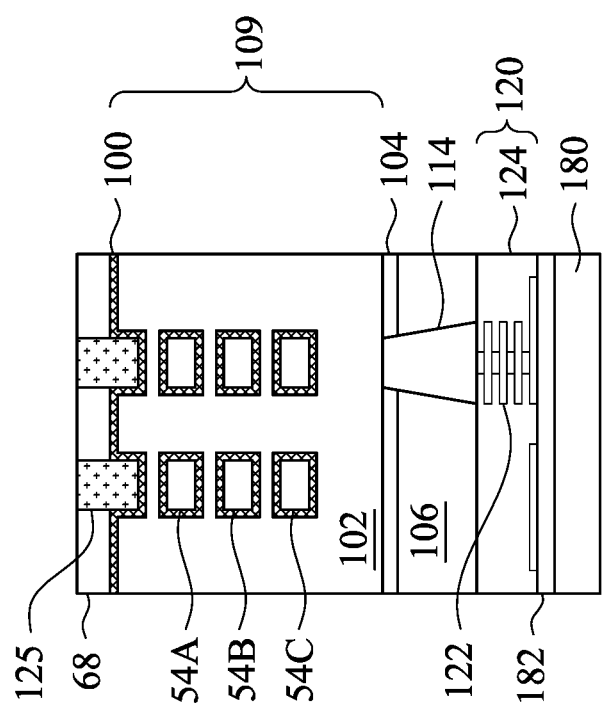
Figure 26C:
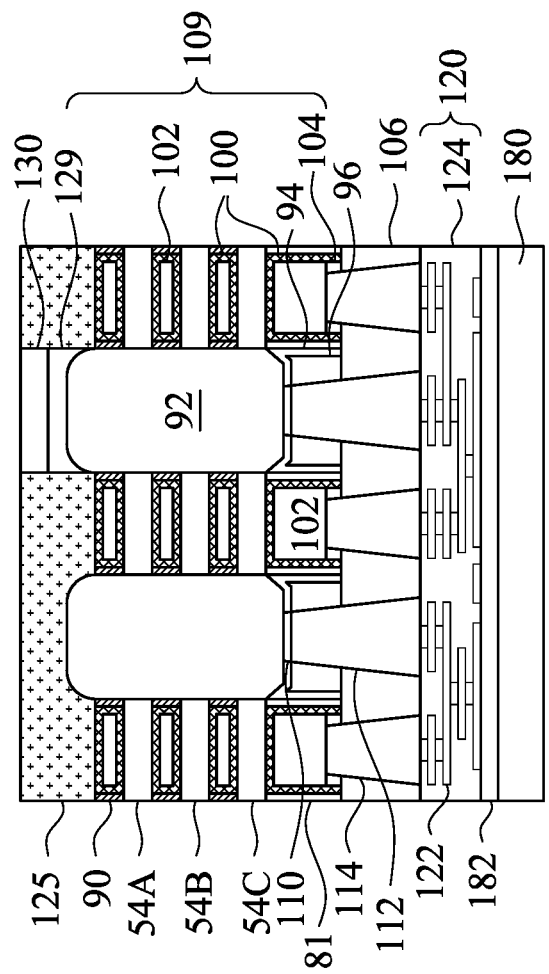

In FIGS. 26A through 26C, backside vias 130 are formed in the fifth recesses 128. The backside vias 130 may extend through the second dielectric layer 125 and the STI regions 68 and may be electrically coupled to the epitaxial source/drain regions 92 through the second silicide regions 129. The backside vias 130 may be similar to the source/drain contacts 112, described above with respect to FIGS. 20A through 20C. For example, the backside vias 130 may be formed of a like material and using a like process as the source/drain contacts 112. The backside vias 130 may include copper, a copper alloy, silver, gold, tungsten, cobalt, aluminum, nickel, ruthenium, or the like. A planarization process, such as a CMP, may be performed to remove excess portions of the backside vias 130, which excess portions are over top surfaces of the STI regions 68 and the second dielectric layer 125.

Figure 27B:
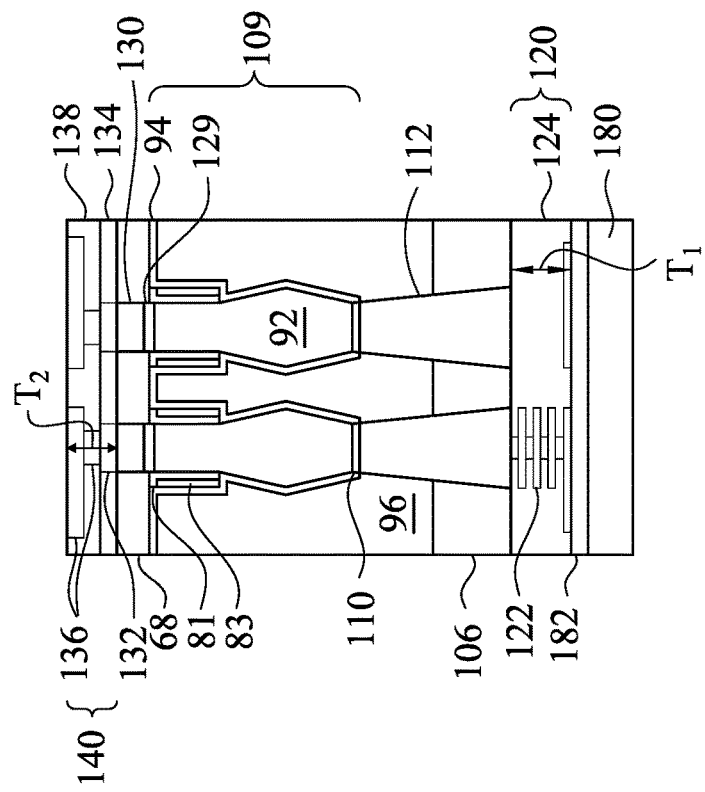
Figure 27A:
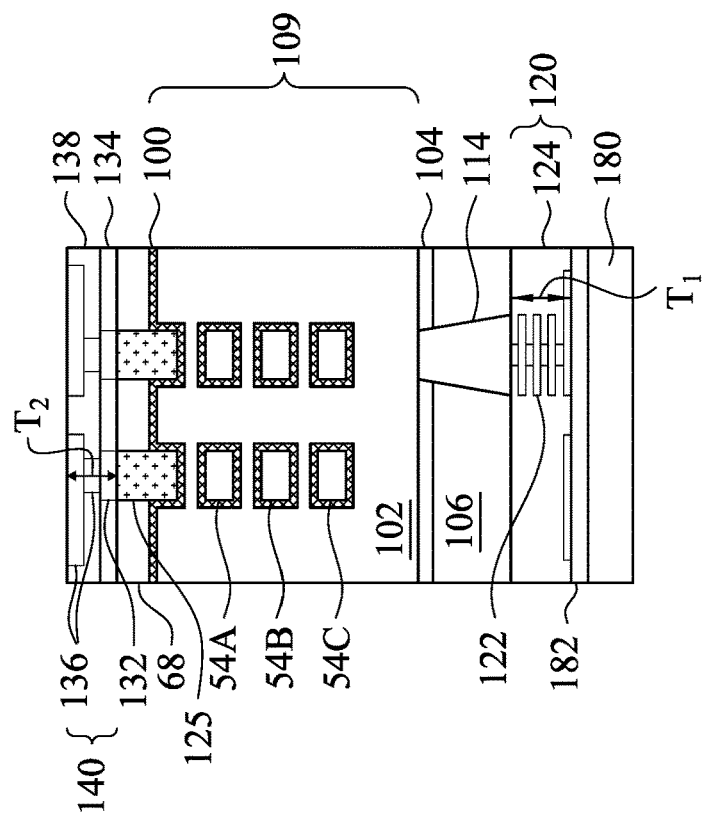
Figure 27C:
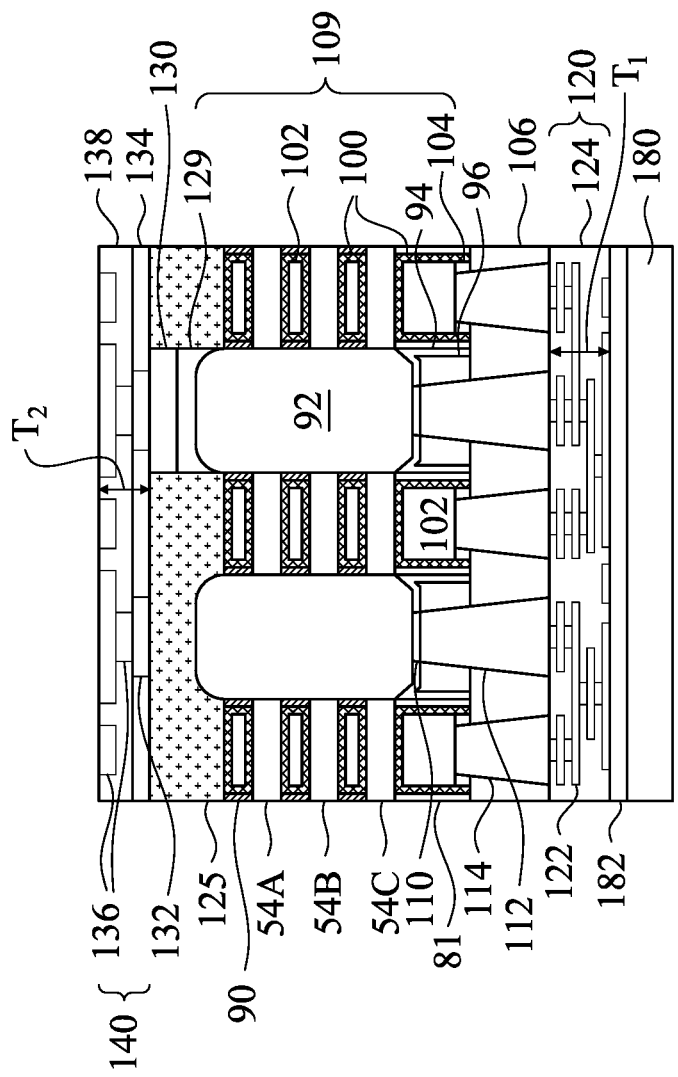

In FIGS. 27A through 27C, first conductive lines 132 and a third dielectric layer 134 are formed. The first conductive lines 132 and the third dielectric layer 134 may be formed over the backside vias 130, the second dielectric layers 125, and the STI regions 68. The third dielectric layer 134 may be formed of materials and in a manner the same as or similar to the second ILD 106, described above with respect to FIGS. 18A through 18C.

The first conductive lines 132 are formed in the third dielectric layer 134. Forming the first conductive lines 132 may include patterning recesses in the third dielectric layer 134 using a combination of photolithography and etching processes, for example. A pattern of the recesses in the third dielectric layer 134 may correspond to a pattern of the first conductive lines 132. The first conductive lines 132 are then formed by depositing a conductive material in the recesses. In some embodiments, the first conductive lines 132 comprise a metal layer, which may be a single layer or a composite layer comprising a plurality of sub-layers formed of different materials. In some embodiments, the first conductive lines 132 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The first conductive lines 132 may be formed using, for example, CVD, ALD, PVD, plating or the like. The first conductive lines 132 are electrically coupled to the epitaxial source/drain regions 92 through the backside vias 130 and the second silicide regions 129. A planarization process (e.g., a CMP, a grinding, an etch-back, or the like) may be performed to remove excess portions of the first conductive lines 132 formed over the third dielectric layer 134.

In some embodiments, the first conductive lines 132 are backside power rails, which are conductive lines that electrically connect the epitaxial source/drain regions 92 to a reference voltage, a supply voltage, or the like. By placing power rails on a backside of the resulting semiconductor die rather than on a front-side of the semiconductor die, advantages may be achieved. For example, by including both the front-side interconnect structure 120 and the backside interconnect structure 140, heat generated in the transistor structures 109 may be dissipated from both sides of the transistor structures 109 through the front-side interconnect structure 120 and the backside interconnect structure 140. Specifically, heat may be dissipated through the first conductive features 122 of the front-side interconnect structure 120 and through the first conductive lines 132 and the second conductive features 136 of the backside interconnect structure 140.

A thickness $T_1$ of the front-side interconnect structure 120 may be reduced by moving the power rails to the backside of the transistor structures 109. The thickness $T_1$ of the front-side interconnect structure 120 may be reduced be at least 50% compared to conventional front-side interconnect structures, and the thickness $T_1$ of the front-side interconnect structure 120 may range from about 0.5 µm to about 2 µm. The number of interconnect layers in the front-side interconnect structure 120 may be reduced to about 6, as opposed to conventional front-side interconnect structures, which may have about 10 interconnect layers. Reducing the thickness of the front-side interconnect structure 120 improves heat dissipation through the front-side interconnect structure 120, and may result in the heat dissipation through the front-side interconnect structure 120 being about 150% of the heat dissipation through conventional front-side interconnect structures.

Further, the conductive features of the backside interconnect structure 140 may have widths greater than the conductive features of the front-side interconnect structure 120

(such as at least about twice a width of conductive features of the front-side interconnect structure 120) a thickness $T_2$ of the backside interconnect structure 140 may be the same as or less than the thickness of the front-side interconnect structure 120. For example, the conductive features of the front-side interconnect structure 120 may have minimum line widths ranging from about 15 nm to about 45 nm, while the conductive features of the backside interconnect structure 140 may have minimum line widths ranging from about 30 nm to about 60 nm. The thickness $T_2$ of the backside interconnect structure 140 may range from about 0.5 µm to about 1 µm. Heat dissipated through the backside interconnect structure 140 may be even greater than the heat dissipated through the front-side interconnect structure 120. For example, the heat dissipation through the backside interconnect structure 140 may be about 300% of the heat dissipation through conventional front-side interconnect structures. As such, the overall heat dissipation through the front-side interconnect structure 120 and the backside interconnect structure 140 may be improved by about 450% compared to conventional devices.

Further, a gate density of the nano-FETs and/or interconnect density of the front-side interconnect structure 120 may be increased. The backside of the semiconductor die may accommodate wider power rails, reducing resistance and increasing efficiency of power delivery to the nano-FETs. For example, a width of the first conductive lines 132 may be at least twice a width of first level conductive lines (e.g., the first conductive features 122) of the front-side interconnect structure 120.

Remaining portions of a backside interconnect structure 140 are formed over the third dielectric layer 134 and the first conductive lines 132. The backside interconnect structure 140 may be referred to as a backside interconnect structure because it is formed on a backside of the transistor structures 109 (e.g., a side of the transistor structures 109 opposite the side of the transistor structure 109 on which active devices are formed). The backside interconnect structure 140 may comprise the third dielectric layer 134 and the first conductive lines 132.

The remaining portions of the backside interconnect structure 140 may comprise materials and be formed using processes the same as or similar to those used for the front-side interconnect structure 120, discussed above with respect to FIGS. 21A through 21C. In particular, the backside interconnect structure 140 may comprise stacked layers of second conductive features 136 formed in fourth dielectric layers 138. The second conductive features 136 may include routing lines (e.g., for routing to and from subsequently formed contact pads and external connectors). The second conductive features 136 may further be patterned to include one or more embedded passive devices such as, resistors, capacitors, inductors, or the like. The embedded passive devices may be integrated with the first conductive lines 132 (e.g., the power rail) to provide circuits (e.g., power circuits) on the backside of the nano-FETs.

Figure 28B:
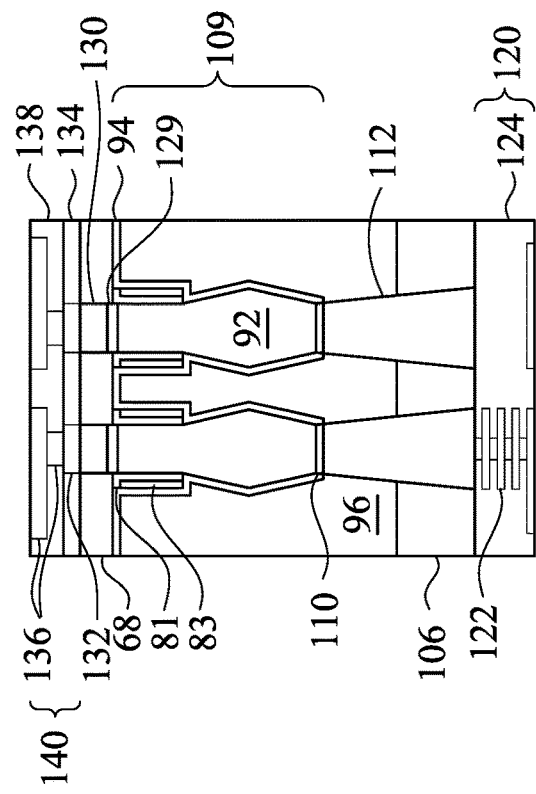
Figure 28A:
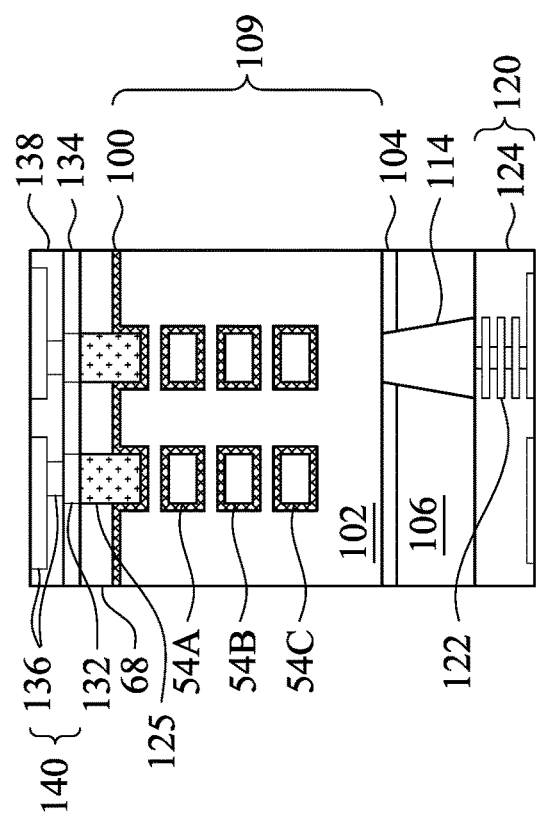
Figure 28C:
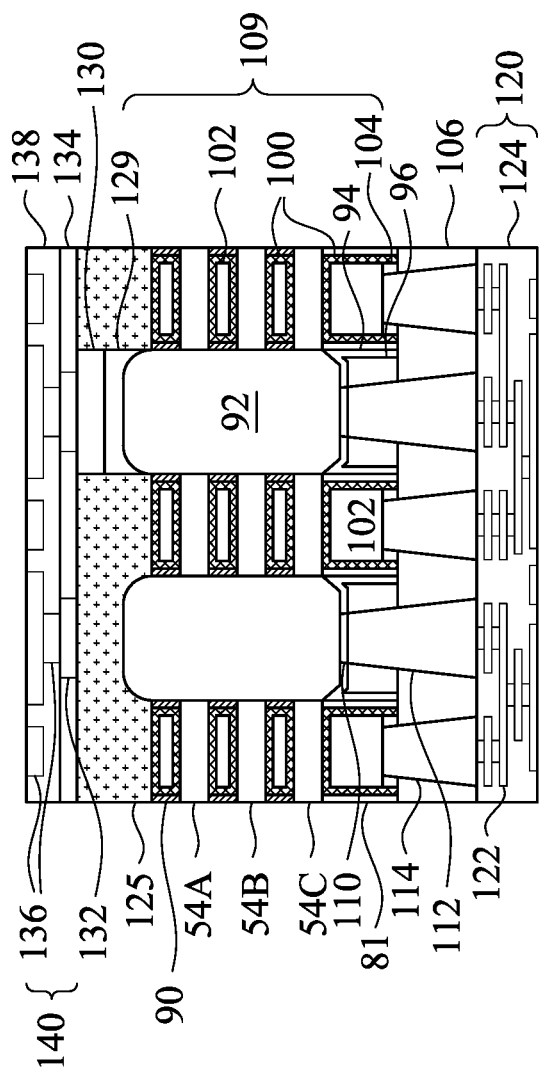

In FIGS. 28A through 28C, a carrier substrate de-bonding is performed to detach (or "de-bond") the carrier substrate 180 from the front-side interconnect structure 120. In some embodiments, the de-bonding includes projecting a light, such as a laser light or an ultraviolet (UV) light on the bonding layers 182 so that the bonding layers 182 decompose under the heat of the light and the carrier substrate 180 can be removed.

Figure 29B:
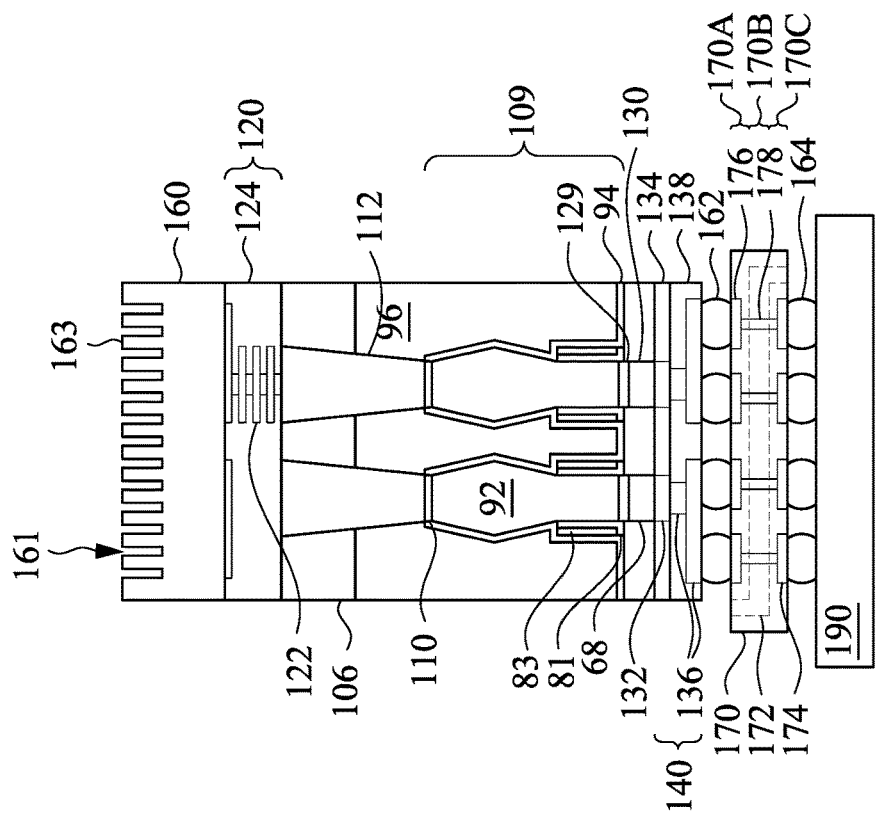
Figure 29A:
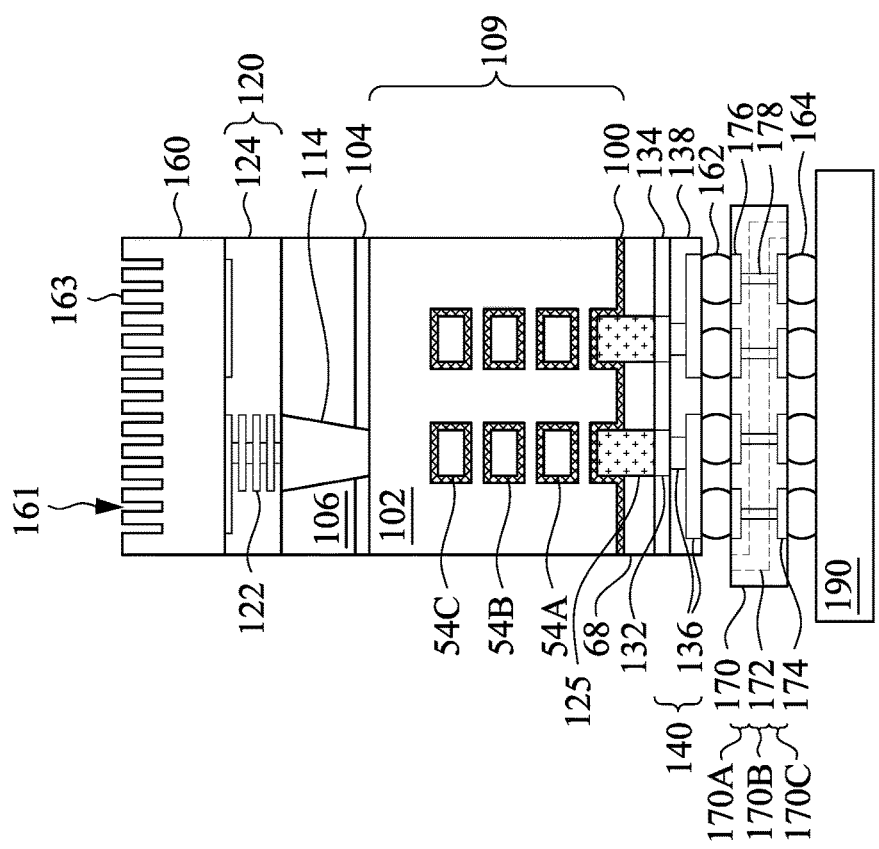
Figure 29C:
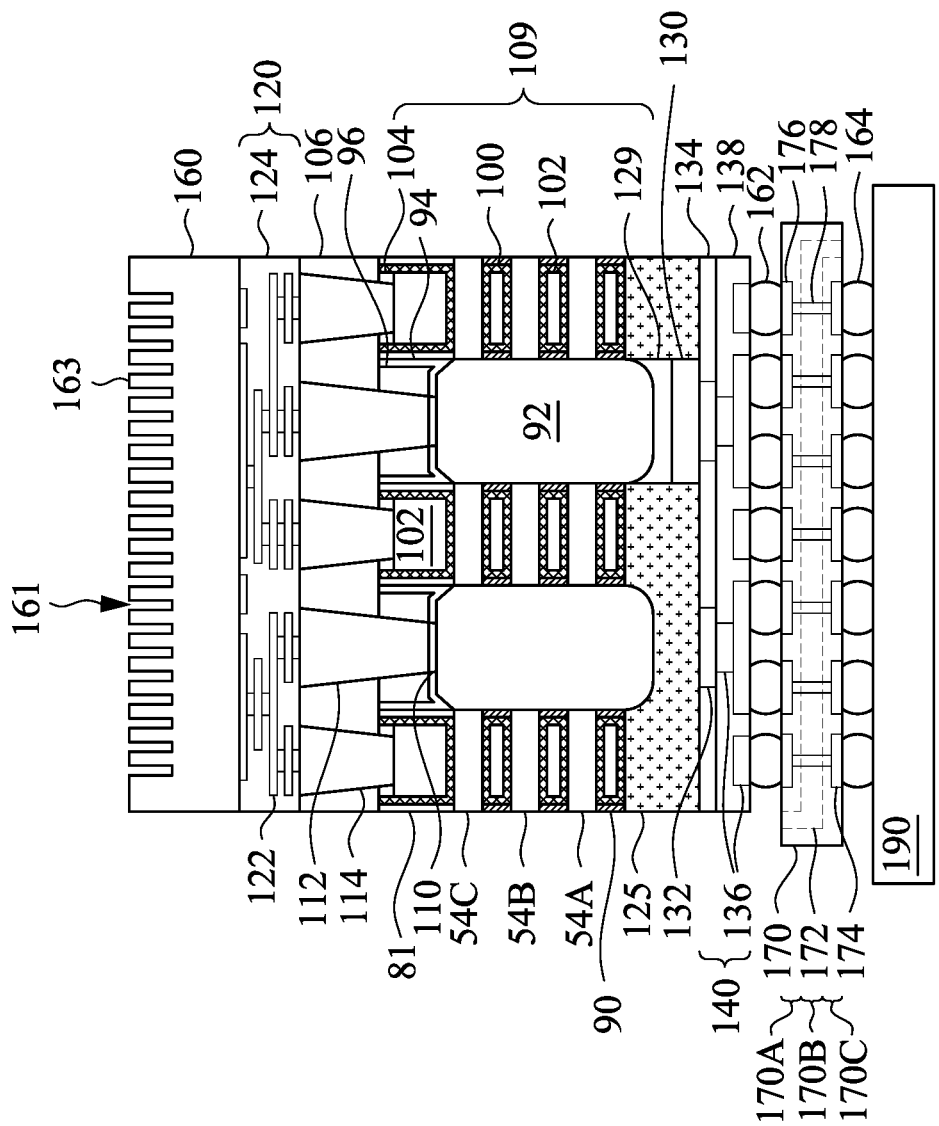

In FIGS. 29A through 29C, the structure of FIGS. 28A through 28C is flipped, a heat sink 160 is attached to the front-side interconnect structure 120, a first substrate 170 is attached to the backside interconnect structure 140, and a second substrate 190 is attached to the first substrate 170. As illustrated in FIGS. 29A through 29C, the heat sink 160 may be attached to the first dielectric layers 124 and the first conductive features 122. In some embodiments, the heat sink 160 may comprise materials such as silicon, glass, a metal, a polymer, or the like. The heat sink 160 may be bonded to the front-side interconnect structure 120 by fusion bonding or the like. In some embodiments, the heat sink 160 may be bonded to the front-side interconnect structure 120 through dielectric-to-dielectric bonding, without using any adhesive material (e.g., die attach film). The bonding may include a pre-bonding and an annealing. During the pre-bonding, a small pressing force is applied to press the heat sink 160 against the front-side interconnect structure 120. The pre-bonding is performed at a low temperature, such as room temperature (e.g., a temperature in the range of about 15° C. to about 30° C.). In some embodiments, oxides, such as native oxides, are formed at the surfaces of the heat sink 160 and the front-side interconnect structure 120 facing one another and are used for the bonding. The bonding strength is then improved in a subsequent annealing step, in which the front-side interconnect structure 120 and the heat sink 160 are annealed at a high temperature, such as a temperature in the range of about 100° C. to about 400° C. After the annealing, bonds, such as fusion bonds, are formed bonding the front-side interconnect structure 120 to the heat sink 160. For example, the bonds can be covalent bonds between the front-side interconnect structure 120 and the heat sink 160. Bonding the heat sink 160 directly to the front-side interconnect structure 120 through fusion bonding may decrease thermal resistance between the heat sink 160 and the front-side interconnect structure 120, which may improve the cooling capacity of the heat sink 160. Bonding the heat sink 160 directly to the front-side interconnect structure 120 may further reduce thermal interface materials used to attach the heat sink 160 to the front-side interconnect structure 120, which reduces costs.

In some embodiments, the heat sink 160 may be attached to the front-side interconnect structure 120 through an adhesive. The heat sink 160 may be attached to the front-side interconnect structure 120 through the adhesive in combination with the dielectric-to-dielectric bonding, or in lieu of the dielectric-to-dielectric bonding. The adhesive may be a thermal interface material (TIM) or other adhesive. The TIM may be an adhesive material having good thermal conductivity. The adhesive may be any suitable adhesive, epoxy, die attach film (DAF), or the like. The adhesive may be deposited between the heat sink 160 and any of the first dielectric layers 124 and/or the first conductive features 122.

As illustrated in FIGS. 29A through 29C, the heat sink 160 may include channels 161 and heat-conducting fins 163 formed in a surface of the heat sink 160 opposite the front-side interconnect structure 120. The channels 161 may be formed by a mechanical process (such as mechanical die sawing or the like), laser cutting, acceptable photolithography and etching techniques, or the like. The channels 161 and the heat-conducting fins 163 may be used to improve heat transfer from the heat sink 160.

The first substrate 170 may be attached to the backside interconnect structure 140 through first conductive connectors 162. The first substrate 170 may include a semiconductor substrate, such as silicon, doped or un-doped, or an active layer of a semiconductor-on-insulator (SOI) substrate. The first substrate 170 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. In some embodiments, the first substrate 170 may be an interposer substrate. In embodiments in which the first substrate 170 is an interposer substrate, the first substrate 170 may be free from active devices and may provide interconnections between the backside interconnect structure 140 and the second substrate 190. The first substrate 170 may include optional passive devices.

The first substrate 170 may include conductive vias 178 (sometimes referred to as through silicon vias or through substrate vias (TSVs)), bond pads 174, bond pads 176, and metallization layers (not separately illustrated). The metallization layers may be designed to connect various devices to form functional circuitry. The metallization layers may be formed of alternating layers of dielectric materials (e.g., low-k dielectric materials) and conductive materials (e.g., copper), with vias interconnecting the layers of conductive materials. The metallization layers may be formed through any suitable processes (such as deposition, damascene, dual damascene, or the like).

In some embodiments, the bond pads 174 and the bond pads 176 may be formed by forming recesses (not separately illustrated) into dielectric layers (not separately illustrated) or the first substrate 170 on opposite sides of the first substrate 170. The recesses may be formed to allow the bond pads 174 and the bond pads 176 to be embedded into the dielectric layers/first substrate 170. In some embodiments, the recesses are omitted and the bond pads 174 and the bond pads 176 may be formed on the dielectric layers/first substrate 170. In some embodiments, the bond pads 174 and the bond pads 176 include a thin seed layer (not separately illustrated) made of copper, titanium, nickel, gold, palladium, the like, or a combination thereof. The conductive materials of the bond pads 174 and the bond pads 176 may be deposited over the thin seed layer. The conductive materials may be formed by an electro-chemical plating process, an electroless plating process, CVD, atomic layer deposition (ALD), PVD, the like, or a combination thereof. In an embodiment, the conductive materials of the bond pads 174 and the bond pads 176 include copper, tungsten, aluminum, silver, gold, the like, or a combination thereof. In some embodiments, the bond pads 174 and the bond pads 176 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 174 and the bond pads 176. In some embodiments, the conductive vias 178 extend through the first substrate 170 and couple at least one of the bond pads 174 to at least one of the bond pads 176.

In some embodiments, channels 172 are formed in the first substrate 170. The channels 172 may be voids in which a coolant, such as oil, water, gas, or the like can flow. The coolant may be conducted into the channels 172 to conduct heat generated in the transistor structures 109 away. The formation of the channels 172 may include etching a first substrate (such as substrate 170B in FIGS. 29A through 29C) to form micro-trenches, covering the micro-trenches with a second and third substrate (such as substrates 170A and 170C) to seal the micro-trenches, and forming openings in the substrates 170A and 170C to connect to the micro-trenches. The openings in the substrates 170A and 170C and the micro-trenches are collectively referred to as the channels 172. The first substrate 170 includes the substrates 170A-170C. The channels 172 are illustrated using dashed lines to indicate they may or may not be formed. In some embodiments, the heat sink 160 may contain channels similar to or the same as the channels 172.

The first substrate 170 may be mechanically and electrically bonded to the front-side interconnect structure 120 by way of the bond pads 176, and first conductive connectors 162. The first conductive connectors 162 may be ball grid array (BGA) connectors, solder balls, metal pillars, controlled collapse chip connection (C4) bumps, micro bumps, electroless nickel-electroless palladium-immersion gold technique (ENEPIG)-formed bumps, or the like. The first conductive connectors 162 may include a conductive material such as solder, copper, aluminum, gold, nickel, silver, palladium, tin, the like, or a combination thereof. The first substrate 170 may be placed over the front-side interconnect structure 120 and a reflow process may be performed to reflow the first conductive connectors 162 and bond the bond pads 176 to the front-side interconnect structure 120 through the first conductive connectors 162.

The second substrate 190 may be attached to the first substrate 170 through second conductive connectors 164. The second conductive connectors 164 may be the same as or similar to the first conductive connectors 162. The second substrate 190 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the second substrate 190 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. In some embodiments, the second substrate 190 may be based on an insulating core such as a fiberglass reinforced resin core. In some embodiments, the core material may be a fiberglass resin such as FR4. In some embodiments, the core material may include bismaleimide-triazine (BT) resin, other printed circuit board (PCB) materials, or other films. Build up films such as laminates may be used for the second substrate 190. The second substrate 190 may be mechanically and electrically bonded to the first substrate 170 by way of the bond pads 174, and the second conductive connectors 164 by a method similar to or the same as the method described above with respect to the first substrate 170 mechanically and electrically bonded to the front-side interconnect structure 120.

As discussed above with respect to FIGS. 27A through 27C, including the backside interconnect structure 140 in addition to the front-side interconnect structure 120 improves heat dissipation from the transistor structures 109. The heat sink 160 may be thermally coupled to the transistor structures 109 through the first conductive features 122 of the front-side interconnect structure 120. The first substrate 170 may be thermally coupled to the transistor structures 109 through the first conductive connectors 162, the second conductive features 136, the first conductive lines 132, and the backside vias 130. The heat sink 160 and the first substrate 170 may be used to further dissipate the heat from the front-side interconnect structure 120 and the backside interconnect structure 140, respectively, further improving heat dissipation from the transistor structures 109. Improving the heat dissipation from the transistor structures 109 improves device performance, and reduces device defects.

Figure 30C:
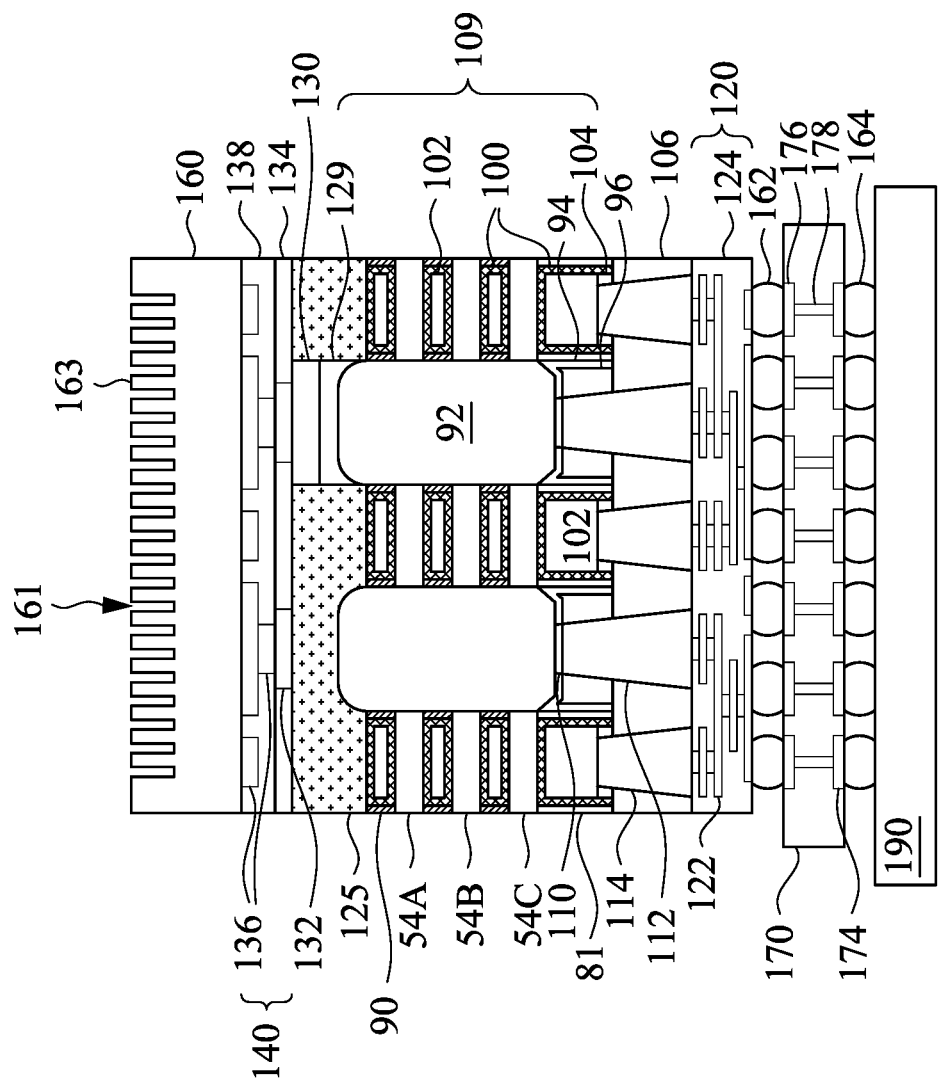

In FIGS. 30A through 30C, a heat sink 160 is attached to the backside interconnect structure 140, a first substrate 170 is attached to the front-side interconnect structure 120, and a second substrate 190 is attached to the first substrate 170. Each of the heat sink 160, the first substrate 170, and the second substrate 190 may be the same as or similar to the heat sink 160, the first substrate 170, and the second substrate 190, respectively, discussed above with respect to FIGS. 29A through 29C and may be attached by means and methods similar to or the same as those discussed above with respect to FIGS. 29A through 29C. The embodiment illustrated in FIGS. 30A through 30C may be similar to the embodiment illustrated in FIGS. 29A through 29C except that the structure illustrated in FIGS. 28A through 28C is not flipped before attaching the heat sink 160, the first substrate 170, and the second substrate 190.

As discussed above with respect to FIGS. 27A through 27C, including the backside interconnect structure 140 in addition to the front-side interconnect structure 120 improves heat dissipation from the transistor structures 109. The first substrate 170 may be thermally coupled to the transistor structures 109 through the first conductive features 122 of the front-side interconnect structure 120. The heat sink 160 may be thermally coupled to the transistor structures 109 through the first conductive connectors 162, the second conductive features 136, the first conductive lines 132, and the backside vias 130. The heat sink 160 and the first substrate 170 may be used to further dissipate the heat from the backside interconnect structure 140 and the front-side interconnect structure 120, respectively, further improving heat dissipation from the transistor structures 109. Improving the heat dissipation from the transistor structures 109 improves device performance, and reduces device defects.

Figure 31B:
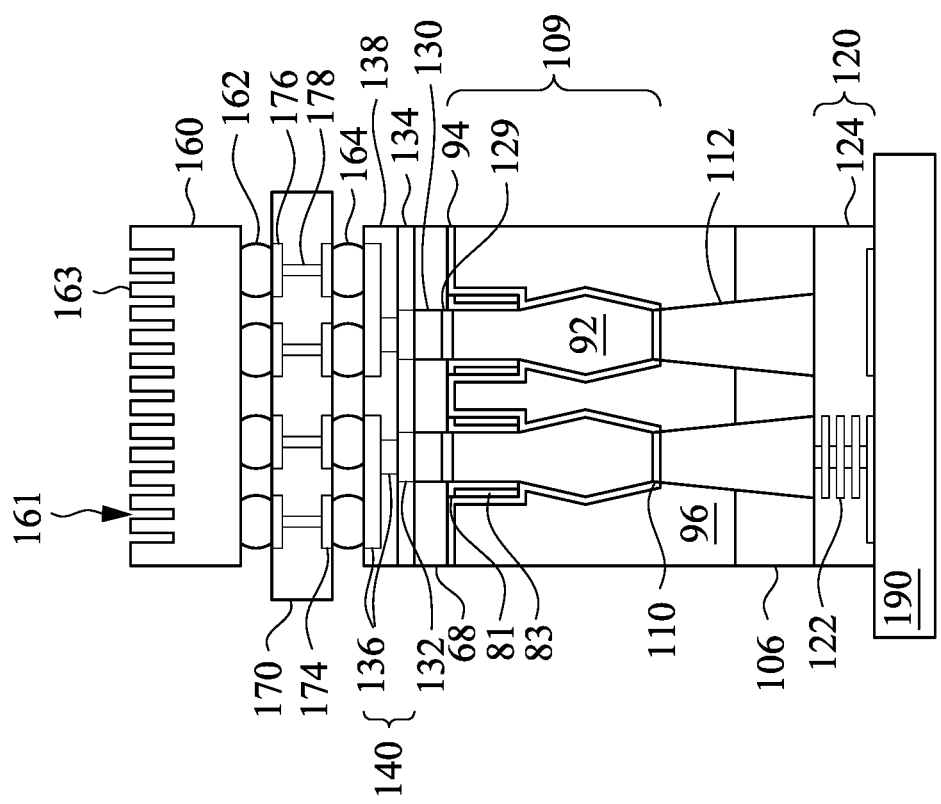
Figure 31A:
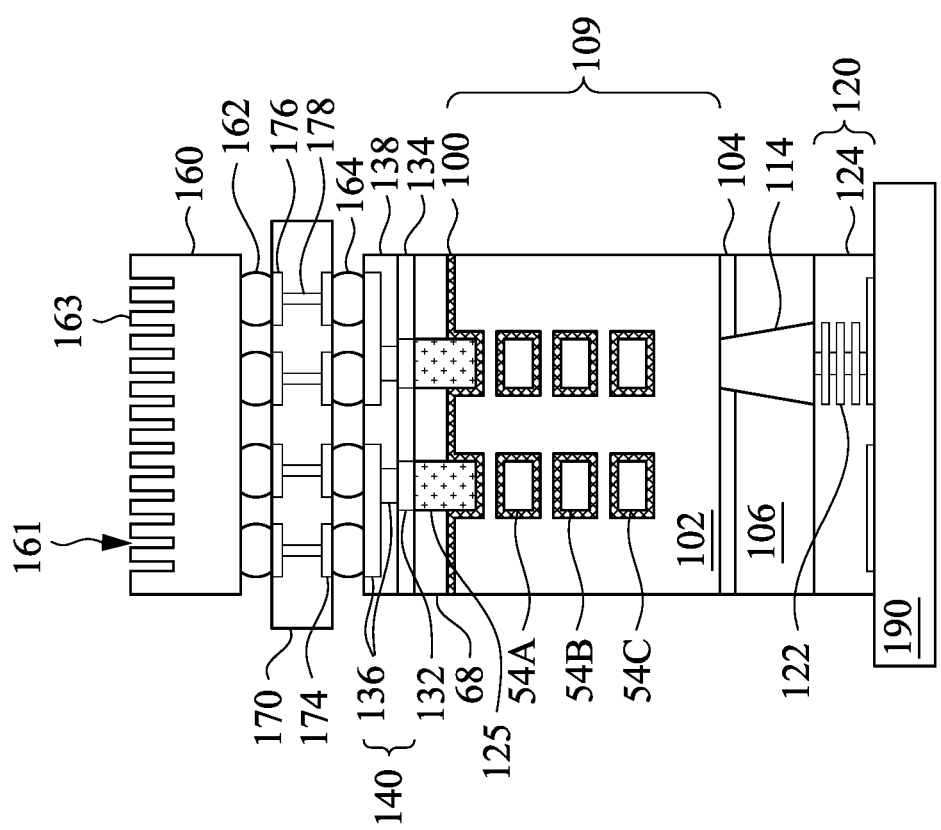
Figure 31C:
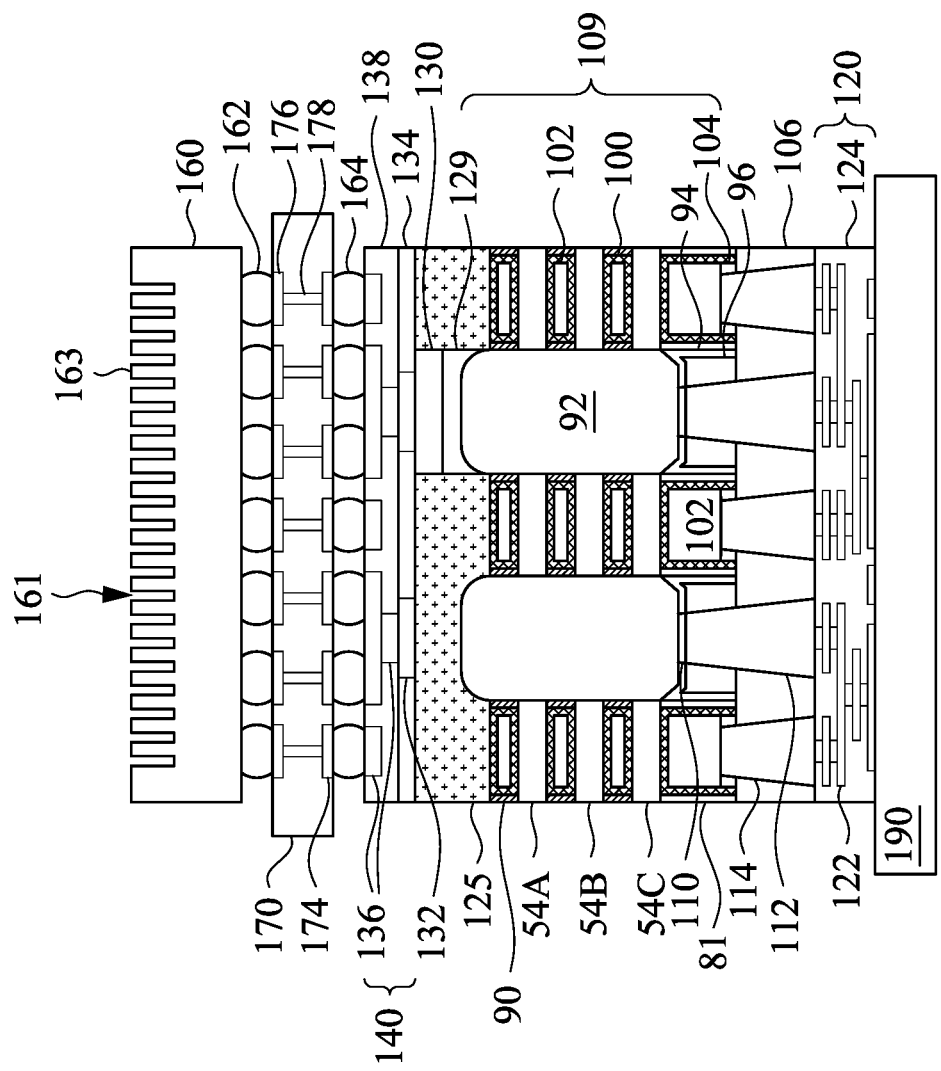

In FIGS. 31A through 31C, a second substrate 190 is attached to the front-side interconnect structure 120, a first substrate 170 is attached to the backside interconnect structure 140, and a heat sink 160 is attached to the first substrate 170 opposite the backside interconnect structure 140. Each of the heat sink 160, the first substrate 170, and the second substrate 190 may be the same as or similar to the heat sink 160, the first substrate 170, and the second substrate 190, respectively, discussed above with respect to FIGS. 29A through 29C and may be attached by means and methods similar to or the same as those discussed above with respect to FIGS. 29A through 29C. The second substrate 190 may be attached to the front-side interconnect structure 120 similar to the heat sink 160 discussed in FIGS. 29A through 29C and the heat sink 160 may be attached to the first substrate 170 similar to the second substrate 190 discussed in FIGS. 29A through 29C. The embodiment illustrated in FIGS. 31A through 31C may be similar to the embodiment illustrated in FIGS. 29A through 29C except that the first substrate 170 is between the backside interconnect structure 140 and the heat sink 160 instead of between the front-side interconnect structure 120 and the second substrate 190.

As discussed above with respect to FIGS. 27A through 27C, including the backside interconnect structure 140 in addition to the front-side interconnect structure 120 improves heat dissipation from the transistor structures 109. The first substrate 170 may be thermally coupled to the transistor structures 109 through the first conductive connectors 162, the second conductive features 136, the first conductive lines 132, and the backside vias 130. The heat sink may be thermally coupled to the transistor structures 109 through the first substrate 170. The second substrate 190 may be thermally coupled to the transistor structures 109 through the first conductive features 122 of the front-side interconnect structure 120. The heat sink 160 and the first substrate 170 may be used to further dissipate the heat from the backside interconnect structure 140, further improving heat dissipation from the transistor structures 109. Improving the heat dissipation from the transistor structures 109 improves device performance, and reduces device defects.

Embodiments may achieve advantages. For example, including the backside interconnect structure 140 in addition to the front-side interconnect structure 120 helps to reduce the thickness of the front-side interconnect structure 120, improving heat dissipation through the front-side interconnect structure 120. The backside interconnect structure 140 may have increased line widths and a reduced thickness as compared to the front-side interconnect structure 120 and may further be used to dissipated heat generated in the transistor structures 109. The front-side interconnect structure 120 and the backside interconnect structure 140 may be attached to the heat sink 160 or first substrate 170, which may further dissipate heat from the front-side interconnect structure 120 and the backside interconnect structure 140. The improved heat dissipation improves device performance and reduces device defects.

In accordance with an embodiment, a device includes a first transistor structure; a front-side interconnect structure on a front-side of the first transistor structure, the front-side interconnect structure including front-side conductive lines; a backside interconnect structure on a backside of the first transistor structure, the backside interconnect structure including backside conductive lines, the backside conductive lines having line widths greater than line widths of the front-side conductive lines; and a first heat dissipation substrate coupled to the backside interconnect structure. In an embodiment, the first heat dissipation substrate includes a heat sink, the heat sink including channels and fins in a surface opposite the backside interconnect structure. In an embodiment, the first heat dissipation substrate includes embedded fluid channels. In an embodiment, the device further includes a second heat dissipation substrate coupled to the front-side interconnect structure. In an embodiment, the front-side interconnect structure has a thickness ranging from 0.5 µm to 2 µm and the backside interconnect structure has a thickness ranging from 0.5 µm to 1 µm. In an embodiment, a minimum line width of the front-side interconnect structure ranges from 15 nm to 45 nm, and a minimum line width of the backside interconnect structure ranges from 30 nm to 60 nm. In an embodiment, the device further includes a second substrate coupled to the first heat dissipation substrate opposite the backside interconnect structure, the second substrate being a printed circuit board.

In accordance with another embodiment, a device includes a gate structure over a semiconductor channel region; a first source/drain region adjacent the gate structure and the semiconductor channel region; a gate contact coupled to a surface of the gate structure facing a first direction; a first source/drain contact coupled to a surface of the first source/drain region facing a second direction opposite the first direction; a first interconnect structure coupled to the first source/drain contact opposite the first source/drain region in the second direction; and a first heat dissipation substrate coupled to the first interconnect structure opposite the first source/drain contact in the second direction. In an embodiment, the first heat dissipation substrate includes a heat sink having fins and channels in a surface opposite the first interconnect structure. In an embodiment, the first heat dissipation substrate includes a plurality of embedded fluid channels. In an embodiment, the device further includes a second interconnect structure coupled to the gate contact opposite the gate structure in the first direction; and a second heat dissipation substrate coupled to the second interconnect structure opposite the gate contact in the first direction. In an embodiment, the second heat dissipation substrate includes a heat sink having fins and channels in a surface opposite the second interconnect structure. In an embodiment, the second heat dissipation substrate includes a plurality of embedded fluid channels. In an embodiment, the device further includes a second heat dissipation substrate coupled to the first heat dissipation substrate opposite the first interconnect structure in the second direction, the second heat dissipation substrate including a heat sink having fins and channels in a surface opposite the first heat dissipation substrate.

In accordance with yet another embodiment, a method includes forming a first transistor on a first substrate; exposing a first epitaxial material, exposing the first epitaxial material including thinning a backside of the first substrate; replacing the first epitaxial material with a first backside via, the first backside via being electrically coupled to a first source/drain region of the first transistor; forming a backside interconnect structure over the first backside via opposite the first source/drain region; and coupling a first heat dissipation substrate to the backside interconnect structure opposite the first backside via. In an embodiment, the method further includes dissipating heat generated in the first transistor through fins disposed in a surface of the first heat dissipation substrate opposite the backside interconnect structure. In an embodiment, the method further includes dissipating heat generated in the first transistor through a fluid disposed in embedded fluid channels in the first heat dissipation substrate. In an embodiment, the method further includes forming a front-side interconnect structure over the first transistor opposite the backside interconnect structure; and coupling a second heat dissipation substrate to the front-side interconnect structure opposite the backside interconnect structure. In an embodiment, the method further includes dissipating heat generated in the first transistor through fins disposed in a surface of the second heat dissipation substrate opposite the front-side interconnect structure. In an embodiment, the method further includes dissipating heat generated in the first transistor through a fluid disposed in embedded fluid channels in the second heat dissipation substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first transistor structure;
   a front-side interconnect structure on a front-side of the first transistor structure, the front-side interconnect structure comprising front-side conductive lines;
   a backside interconnect structure on a backside of the first transistor structure, the backside interconnect structure comprising backside conductive lines, the backside conductive lines having line widths greater than line widths of the front-side conductive lines; and
   a first heat dissipation substrate coupled to the backside interconnect structure.

2. The device of claim 1, wherein the first heat dissipation substrate comprises a heat sink, the heat sink comprising channels and fins in a surface opposite the backside interconnect structure.

3. The device of claim 1, wherein the first heat dissipation substrate comprises embedded fluid channels.

4. The device of claim 1, further comprising a second heat dissipation substrate coupled to the front-side interconnect structure.

5. The device of claim 1, wherein the front-side interconnect structure has a thickness ranging from 0.5 µm to 2 µm and the backside interconnect structure has a thickness ranging from 0.5 µm to 1 µm.

6. The device of claim 1, wherein a minimum line width of the front-side interconnect structure ranges from 15 nm to 45 nm, and wherein a minimum line width of the backside interconnect structure ranges from 30 nm to 60 nm.

7. The device of claim 1, further comprising a second substrate coupled to the first heat dissipation substrate opposite the backside interconnect structure, wherein the second substrate is a printed circuit board.

8. A device comprising:
   a first transistor structure;
   a front-side interconnect structure on a front-side of the first transistor structure, the front-side interconnect structure comprising front-side conductive lines;
   a backside interconnect structure on a backside of the first transistor structure, the backside interconnect structure comprising backside conductive lines, the backside conductive lines having line widths greater than line widths of the front-side conductive lines; and
   a first heat dissipation substrate coupled to the backside interconnect structure, wherein the first heat dissipation substrate comprises a heat sink.

9. The device of claim 8, wherein the heat sink comprises channels and fins.

10. The device of claim 9, wherein the channels and fins of the heat sink are in a surface opposite the backside interconnect structure.

11. The device of claim 1, further comprising a second heat dissipation substrate coupled to the front-side interconnect structure.

12. The device of claim 8, wherein the front-side interconnect structure has a thickness ranging from 0.5 µm to 2 µm and the backside interconnect structure has a thickness ranging from 0.5 µm to 1 µm.

13. The device of claim 8, wherein a minimum line width of the front-side interconnect structure ranges from 15 nm to 45 nm, and wherein a minimum line width of the backside interconnect structure ranges from 30 nm to 60 nm.

14. The device of claim 8, further comprising a second substrate coupled to the first heat dissipation substrate opposite the backside interconnect structure, wherein the second substrate is a printed circuit board.

15. The device of claim 8, wherein the first transistor structure comprises:
   a gate structure over a semiconductor channel region;
   a first source/drain region adjacent the gate structure and the semiconductor channel region;

a gate contact coupled to a surface of the gate structure facing a first direction; and a first source/drain contact coupled to a surface of the first source/drain region facing a second direction opposite the first direction, the backside interconnect structure coupled to the first source/drain contact.

16. A device comprising:

a first transistor structure;

a front-side interconnect structure on a front-side of the first transistor structure, the front-side interconnect structure comprising front-side conductive lines;

a backside interconnect structure on a backside of the first transistor structure, the backside interconnect structure comprising backside conductive lines, the backside conductive lines having line widths greater than line widths of the front-side conductive lines; and a first heat dissipation substrate coupled to the backside interconnect structure, wherein the first heat dissipation substrate comprises embedded fluid channels.

17. The device of claim 16, further comprising a second heat dissipation substrate coupled to the front-side interconnect structure.

18. The device of claim 16, wherein the front-side interconnect structure has a thickness ranging from 0.5 μm to 2 μm and the backside interconnect structure has a thickness ranging from 0.5 μm to 1 μm.

19. The device of claim 16, further comprising a second substrate coupled to the first heat dissipation substrate opposite the backside interconnect structure, wherein the second substrate is a printed circuit board.

20. The device of claim 16, wherein the first transistor structure comprises:

a gate structure over a semiconductor channel region;

a first source/drain region adjacent the gate structure and the semiconductor channel region;

a gate contact coupled to a surface of the gate structure facing a first direction; and a first source/drain contact coupled to a surface of the first source/drain region facing a second direction opposite the first direction, the backside interconnect structure coupled to the first source/drain contact.

\* \* \* \* \*